(12) United States Patent
Katagiri

(10) Patent No.: US 10,334,196 B2
(45) Date of Patent: Jun. 25, 2019

(54) SEMICONDUCTOR DEVICE

(71) Applicant: Semiconductor Energy Laboratory Co., Ltd., Atsugi-shi, Kanagawa-ken (JP)

(72) Inventor: Haruki Katagiri, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 233 days.

(21) Appl. No.: 15/393,635

(22) Filed: Dec. 29, 2016

(65) Prior Publication Data

US 2017/0214876 A1  Jul. 27, 2017

(30) Foreign Application Priority Data

Jan. 25, 2016  (JP) .................................. 2016-011474

(51) Int. Cl.
*H02M 7/04* (2006.01)
*H01L 27/12* (2006.01)
*H04N 5/378* (2011.01)
*G06K 19/077* (2006.01)
*H01L 27/092* (2006.01)
(Continued)

(52) U.S. Cl.
CPC ....... *H04N 5/378* (2013.01); *G06K 19/07701* (2013.01); *H01L 27/092* (2013.01); *H01L 27/124* (2013.01); *H01L 27/1207* (2013.01); *H01L 27/1225* (2013.01); *H01L 27/1255* (2013.01); *H01L 29/7869* (2013.01);
(Continued)

(58) Field of Classification Search
CPC . H04N 5/378; H01L 27/1255; H01L 27/1207; H01L 27/1225; H01L 27/124; H01L 27/092

USPC .......................................... 341/122, 155, 144
See application file for complete search history.

(56) References Cited

U.S. PATENT DOCUMENTS

| 4,728,819 A | 3/1988 | Vu |
| 5,059,982 A | 10/1991 | Bacrania et al. |

(Continued)

FOREIGN PATENT DOCUMENTS

| JP | 58-111528 A | 7/1983 |
| JP | 10-078836 A | 3/1998 |

(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Brian K Young
(74) *Attorney, Agent, or Firm* — Robinson Intellectual Property Law Office; Eric J. Robinson

(57) ABSTRACT

A semiconductor device that can extend the range of adaptable sampling rate when performing analog/digital conversion is provided. The semiconductor device includes a plurality of sample-and-hold circuits storing an analog signal and a plurality of converter circuits having a function of converting the analog signal stored in the sample-and-hold circuit into a digital signal. The sample-and-hold circuit includes a switch and a capacitor that is supplied with an analog signal through the switch. The switch includes an oxide semiconductor in a channel formation region.

15 Claims, 18 Drawing Sheets

(51) Int. Cl.
*H01L 29/786* (2006.01)
*H04N 5/374* (2011.01)

(52) U.S. Cl.
CPC ........ *H01L 29/78648* (2013.01); *H02M 7/04* (2013.01); *H04N 5/374* (2013.01)

(56) References Cited

U.S. PATENT DOCUMENTS

| | | | |
|---|---|---|---|
| 6,656,774 | B1 | 12/2003 | Chow et al. |
| 6,788,567 | B2 | 9/2004 | Fujimori |
| 6,944,045 | B2 | 9/2005 | Fujimori |
| 7,187,045 | B2 | 3/2007 | Braddock |
| 7,659,844 | B2 * | 2/2010 | Tseng ..................... H03M 1/54 341/136 |
| 7,674,650 | B2 | 3/2010 | Akimoto et al. |
| 7,701,376 | B2 | 4/2010 | Oshima et al. |
| 7,821,441 | B2 | 10/2010 | Westwick et al. |
| 8,289,753 | B2 | 10/2012 | Yamazaki et al. |
| 8,446,171 | B2 | 5/2013 | Takahashi |
| 8,610,611 | B2 | 12/2013 | Venkatraman et al. |
| 9,722,624 | B2 * | 8/2017 | Lee ....................... H03M 1/468 |
| 9,793,911 | B2 * | 10/2017 | Usui .................... H03M 1/1245 |
| 9,859,910 | B1 * | 1/2018 | Kim .................... H03M 1/0678 |
| 2011/0089975 | A1 | 4/2011 | Yamazaki et al. |
| 2011/0101332 | A1 | 5/2011 | Yamazaki et al. |
| 2011/0121878 | A1 | 5/2011 | Kato et al. |
| 2011/0148463 | A1 | 6/2011 | Kato et al. |
| 2011/0176357 | A1 | 7/2011 | Koyama et al. |
| 2011/0187410 | A1 | 8/2011 | Kato et al. |
| 2012/0112937 | A1 | 5/2012 | Yamase et al. |
| 2012/0248451 | A1 | 10/2012 | Sone et al. |
| 2016/0094236 | A1 | 3/2016 | Shionoiri et al. |

FOREIGN PATENT DOCUMENTS

| | | |
|---|---|---|
| JP | 2006-222548 A | 8/2006 |
| JP | 2007-006290 A | 1/2007 |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

* cited by examiner

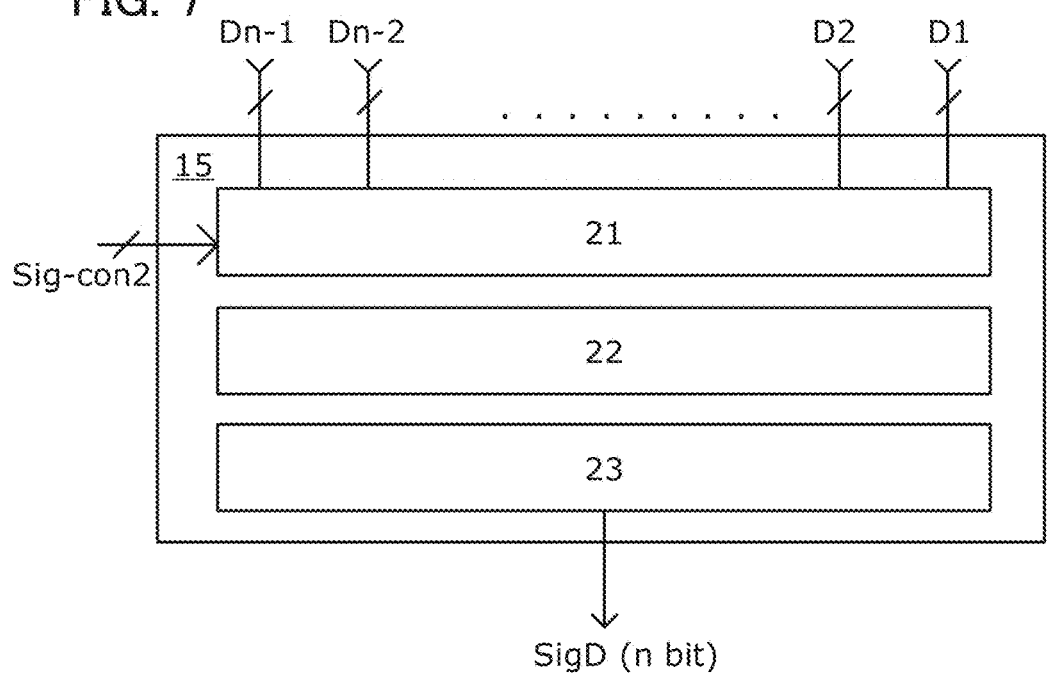

SEMICONDUCTOR DEVICE

BACKGROUND OF THE INVENTION

1. Field of the Invention

One embodiment of the present invention related to a semiconductor device such as an analog/digital converter circuit.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

An analog/digital converter circuit (ADC) which converts an analog signal into a digital signal can convert physical quantities of analog values obtained from a sensor into digital values and is provided in a semiconductor device as an interface of an integrated circuit processing a digital signal.

Patent Document 1 discloses a structure of a pipeline type of an analog-digital converter which can perform AD conversion at high speed.

REFERENCE

Patent Document

[Patent Document 1] Japanese Published Patent Application No. 2006-222548

SUMMARY OF THE INVENTION

There are some types of ADCs and characteristics such as a sampling rate and power consumption differ among the types. The type of an ADC is determined in accordance with required characteristics of the ADC for a variety of uses. Thus, the ADC which has the wider range of adaptable sampling rate can extend the usable range.

In view of the above technical background, an object of one embodiment of the present invention is to provide a semiconductor device which can extend the range of adaptable sampling rate when performing analog/digital conversion.

Another object of one embodiment of the present invention is to provide a novel semiconductor device or the like. Note that the description of these objects does not exclude the existence of other objects. In one embodiment of the present invention, there is no need to achieve all the objects. Other objects are apparent from and can be derived from the description of the specification, the drawings, and the claims.

A semiconductor device of one embodiment of the present invention includes a switch, a capacitor supplied with a potential of an analog signal through the switch, and a circuit configured to convert the analog signal supplied to the capacitor into a digital signal. The switch includes an oxide semiconductor in a channel formation region.

A semiconductor device of one embodiment of the present invention includes a first sample-and-hold circuit, a second sample-and-hold circuit, a first converter circuit, a second converter circuit, and a digital circuit. The first sample-and-hold circuit includes a first switch and a first capacitor supplied with a potential of a first analog signal through the first switch. The first converter circuit is configured to convert the first analog signal supplied to the first capacitor into a first digital signal, convert the first analog signal into a second analog signal, and generate a third analog signal by subtracting a potential of the second analog signal from the potential of the first analog signal. The second sample-and-hold circuit includes a second switch, a second capacitor supplied with a potential of the third analog signal through the second switch. The second converter circuit is configured to convert the third analog signal supplied to the second capacitor into a second digital signal, convert the second digital signal into a fourth analog signal, and generate a fifth analog signal by subtracting a potential of the fourth signal from the potential of the third analog signal. The digital circuit is configured to generate a third digital signal corresponding to the first analog signal by using the first digital signal and the second digital signal. The switch includes an oxide semiconductor in a channel formation region.

With such a structure, one embodiment of the present invention can provide a semiconductor device which can extend the range of adaptable sampling rate when performing analog/digital conversion.

Note that one embodiment of the present invention can provide a novel semiconductor device or the like. Note that the description of these effects does not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIG. 7 illustrates a structure example of a digital circuit.

DETAILED DESCRIPTION OF THE INVENTION

Figure 1:
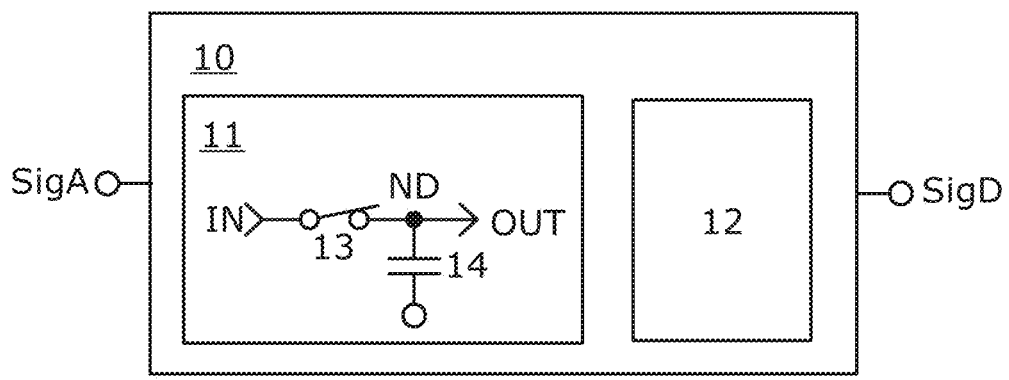
FIG. 1 illustrates a structure example of a semiconductor device.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relation of circuit blocks illustrated in a block diagram is specified for description. Even when a block diagram shows that different functions are achieved by different circuit blocks, one circuit block may be actually configured to achieve different functions. The functions of circuit blocks are specified for description, and even in the case where one circuit block is illustrated, blocks might be provided in an actual circuit block so that processing performed by one circuit block is performed by a plurality of circuit blocks.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a storage device, a display device, a light-emitting device, a lighting device, an electronic device, and the like themselves might be semiconductor devices, or might each include a semiconductor device.

Furthermore, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, X and Y each denote an object (e.g., a device, an element, a circuit, a wiring, an electrode, a terminal, a conductive film, or a layer).

Note that a transistor includes three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In many cases, a voltage refers to a potential difference between a certain potential and a reference potential (e.g., a ground potential (GND) or a source potential). Thus, a voltage can be referred to as a potential and vice versa. Note that the potential indicates a relative value. Accordingly, "ground potential" does not necessarily mean 0 V.

In this specification and the like, the terms "film" and "layer" can be interchanged depending on the case or circumstances. For example, in some cases, the term "conductive film" can be used instead of the term "conductive layer," and the term "insulating layer" can be used instead of the term "insulating film".

In this specification and the like, ordinal numbers such as first, second, and third are used to avoid confusion among components, and the terms do not limit the components numerically or do not limit the order.

Embodiment 1

A structure of a semiconductor device of one embodiment of the present invention is illustrated in FIG. 1, as an example. A semiconductor device 10 shown in FIG. 1 includes a sample-and-hold circuit 11 and a converter circuit 12. The sample-and-hold circuit 11 has a function of acquiring and storing a potential of an analog signal (SigA).

Specifically, the sample-and-hold circuit 11 in FIG. 1 includes a switch 13 and a capacitor 14. The switch 13 has a function of controlling the supply of a potential which is input to an input terminal IN of the sample-and-hold circuit 11 to a node ND. Alternatively, the switch 13 has a function of controlling the supply of a potential which corresponds to the potential input to the input terminal IN of the sample-and-hold circuit 11 to the node ND. The capacitor 14 has a function of accumulating charges in response to the potential supplied to the node ND. Specifically, the capacitor 14 includes a pair of electrodes. One of a pair of electrodes of the capacitor 14 is electrically connected to the node ND, and a predetermined potential such as a ground potential or a low-level potential is applied to the other electrode of the pair of electrodes of the capacitor 14. The potential of the node ND is applied to an output terminal OUT of the sample-and-hold circuit 11.

The converter circuit 12 has a function of generating a digital signal (SigD) in response to the potential stored in the node ND of the sample-and-hold circuit 11. The digital signal (SigD) generated in the converter circuit 12 is output from the semiconductor device 10.

Figure 2A:
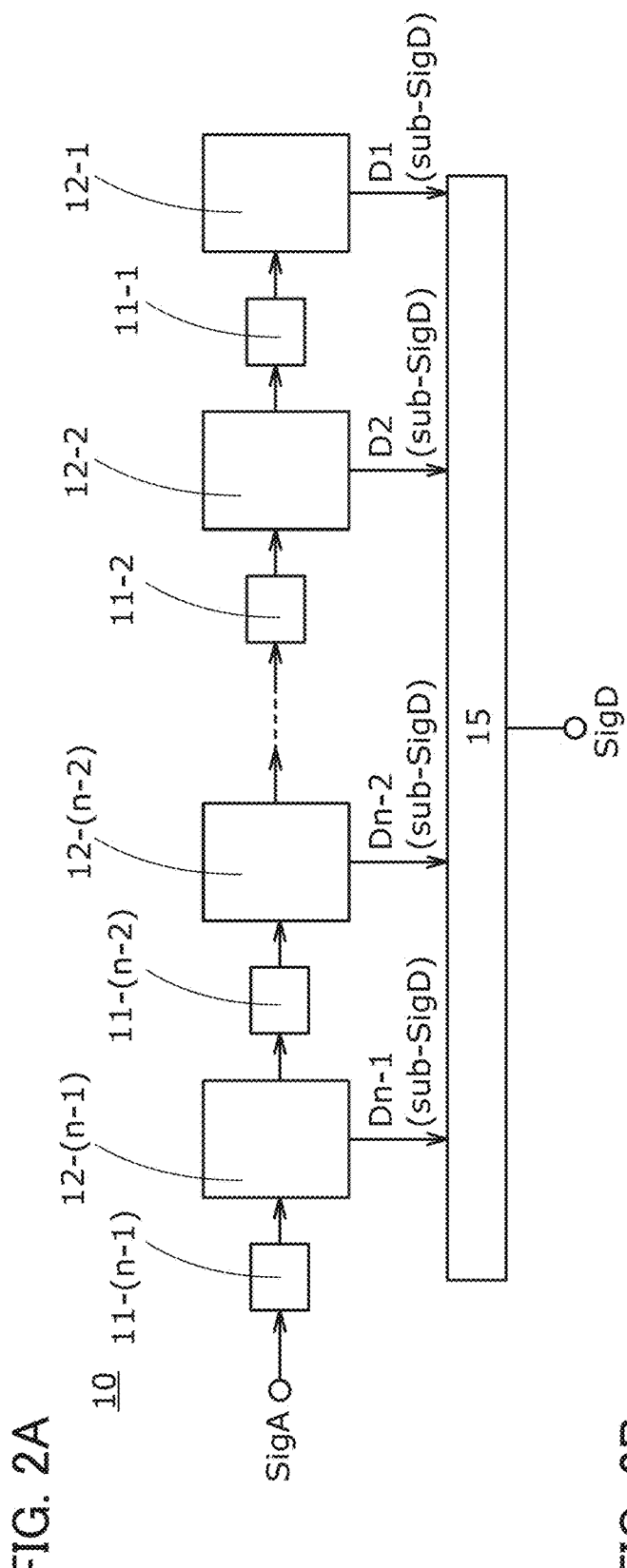
FIGS. 2A and 2B illustrate structure examples of a semiconductor device.

FIG. 2A illustrates a structure example of the semiconductor device 10 functioning as a pipeline type ADC by including the plurality of sample-and-hold circuits 11 and the plurality of converter circuits 12.

FIG. 2A illustrates a structure example of the semiconductor device 10 in which an n-bit digital signal (SigD) is generated with use of the analog signal (SigA). Specifically, the semiconductor device 10 in FIG. 2A includes n−1 sample-and-hold circuits 11 denoted by sample-and-hold circuits 11-1 to 11-(n−1), n−1 converter circuits 12 denoted by converter circuits 12-1 to 12-(n−1), and a digital circuit 15.

Each of the sample-and-hold circuits 11-1 to 11-(n−1) has a function of acquiring and storing the potential of an input analog signal in a manner similar to the sample-and-hold circuit 11 in FIG. 1. Each of the converter circuits 12-1 to 12-(n−1) has a function of generating a t-bit (t is an arbitrary number greater than or equal to 1 and less than n) digital signal (sub-SigD) in response to the potential stored in the nodes ND of the sample-and-hold circuits 11-1 to 11-(n−1).

Furthermore, the converter circuits 12-1 to 12-(n−1) in FIG. 2A has a function of converting the generated digital signal (sub-SigD) into an analog signal (sub-SigA) and a function of generating an analog signal (out-SigA) by obtaining the difference between an input analog signal (in-SigA) and the analog signal (sub-SigA).

Specifically, the converter circuits 12-1 to 12-(n−1) has a function of generating the analog signal (out-SigA) with the potential difference by obtaining the potential difference through subtraction of the analog signal (sub-SigA) generated in the converter circuits 12-1 to 12-(n−1) from the potential of an analog signal (in-SigA) input to each of the converter circuits 12-1 to 12-(n−1).

In FIG. 2A, the converter circuit 12 is electrically connected to the sample-and-hold circuit 11 in the subsequent stage, and the sample-and-hold circuit 11 in the next stage is electrically connected to the converter circuit 12 in the subsequent stage. Specifically, the input terminal of the converter circuit 12-m (m is an arbitrary natural number of 2 to (n−1)) is electrically connected to the output terminal of the sample-and-hold circuit 11-m in the previous stage. The output terminal of the converter circuit 12-m is electrically connected to the input terminal of the sample-and-hold circuit 11-(m−1) in the subsequent stage. Accordingly, the analog signal (out-SigA) output from the output terminal of the converter circuit 12-m is input to and stored in the sample-and-hold circuit 11-(m−1) in the subsequent stage.

Note that the analog signal (SigA) is applied to the input terminal as the analog signal (in-SigA) in the sample-and-hold circuit 11-(n−1) in the most previous stage. The input terminal of the converter circuit 12-1 is electrically connected to the output terminal of the sample-and-hold circuit 11-1 in the previous stage.

The timing of generating the digital signal (sub-SigD) in each converter circuit 12 is more delayed in the converter circuit 12 in the subsequent stages. In FIG. 2A, digital signals (sub-SigD) generated in the converter circuits 12-1 to 12-(n−1) are denoted by digital signals D1 to Dn−1, respectively. Specifically, in the semiconductor device 10 in FIG. 2A, the timing of outputting the digital signal Dn−1 output from the converter circuit 12-(n−1) is the earliest among the digital signals D1 to Dn−1, and the timing outputting of the digital signal D1 from the converter circuit 12-1 is the latest among the digital signals D1 to Dn−1. The digital circuit 15 has a function of correcting the delay of the digital signal (sub-SigD) generated in each converter circuit 12 and a function of generating the n-bit digital signal (SigD) by adding the digital signal (sub-SigD) whose delay is corrected.

Figure 2B:
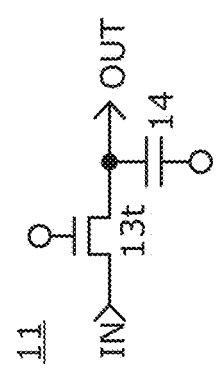

FIG. 2B illustrates an example of a specific structure of the sample-and-hold circuit 11. The sample-and-hold circuit 11 in FIG. 2B includes a transistor 13t serving as the switch 13 and the capacitor 14. One of a source and a drain of the transistor 13t is electrically connected to the input terminal IN of the sample-and-hold circuit 11, and the other of the source and the drain of the transistor 13t is electrically connected to the node ND and the output terminal OUT of the sample-and-hold circuit 11. One of a pair of electrodes of the capacitor 14 is electrically connected to the node ND, and a predetermined potential such as a ground potential or a low-level potential is applied to the other of the pair of electrodes of the capacitor 14. The potential of the node ND is applied to the output terminal OUT of the sample-and-hold circuit 11.

Figure 3:
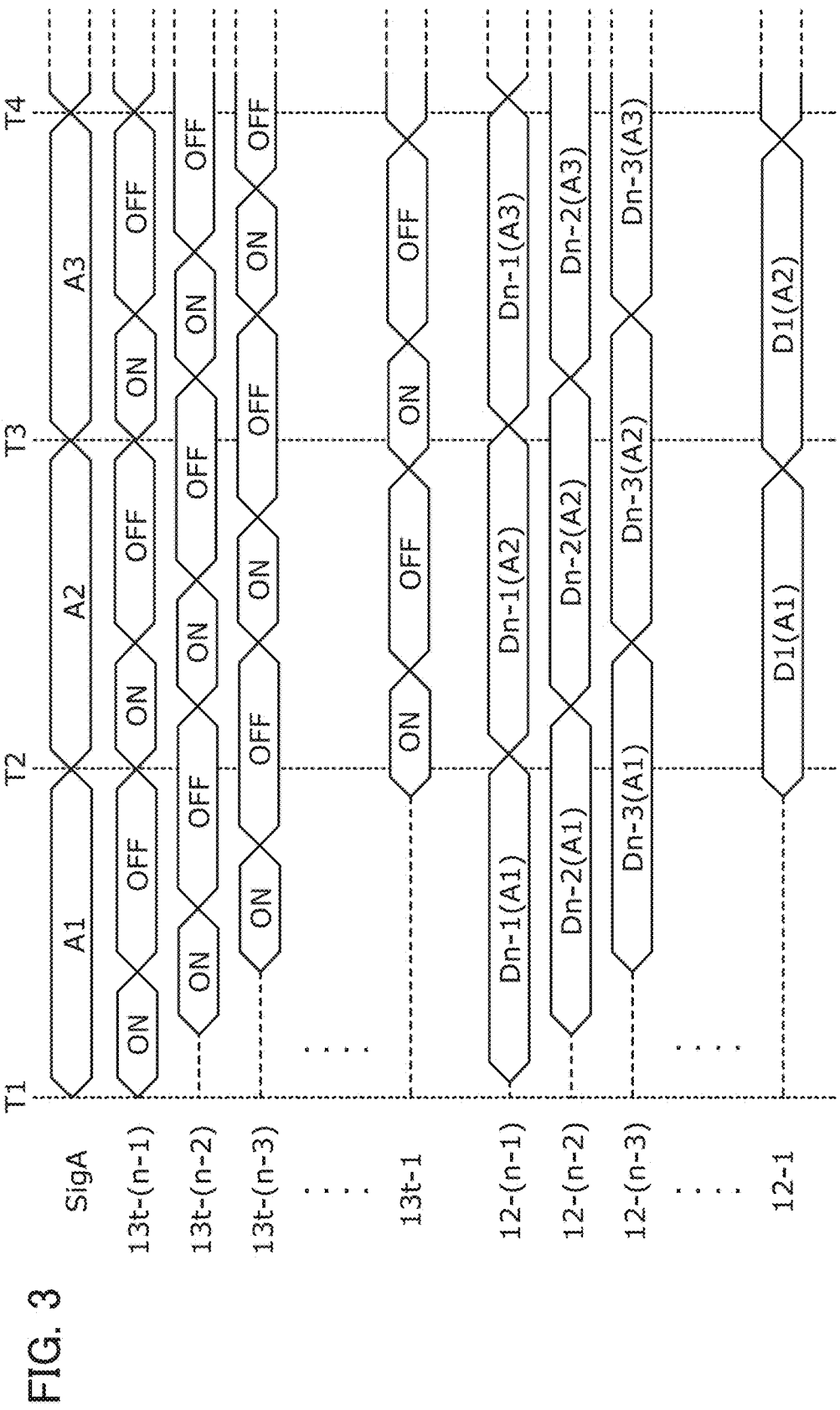
FIG. 3 illustrates a timing chart.

Next, an operation example of the semiconductor device 10 illustrated in FIGS. 2A and 2B is described using a timing chart in FIG. 3. In the following description, an operation example of the semiconductor device 10 is described when a 1-bit digital signal (sub-SigD) is output from each converter circuit 12. A timing chart in FIG. 3 illustrates the following changes over time: information A1, A2, and A3 included in the analog signal (SigA) applied to the input terminal of the semiconductor device 10, an operation state of the transistor 13t included in each sample-and-hold circuit 11, and information included in the digital signal (sub-SigD) output from each converter circuit 12.

After time T1, the analog signal (SigA) including the information A1 is input to the semiconductor device 10. In the sample-and-hold circuit 11-(n−1), a transistor 13t-(n−1) included in the sample-and-hold circuit 11-(n−1) is turned on and the analog signal (SigA) including the information A1 is sampled. Specifically, the potential of the analog signal (SigA) including the information A1 is applied to the node ND of the sample-and-hold circuit 11-(n−1). The potential applied to the node ND is applied to the input terminal of the converter circuit 12-(n−1) from the output terminal of the sample-and-hold circuit 11-(n−1).

Note that the transistor 13t-(n−1) is turned off after determining the potential of the node ND in the sample-and-hold circuit 11-(n−1).

The converter circuit 12-(n−1) generates the most significant bit digital signal Dn−1 (A1) corresponding to the information A1 in response to the applied potential. The generated digital signal Dn−1(A1) is applied to the digital circuit 15. The converter circuit 12-(n−1) converts the generated digital signal Dn−1(A1) into the analog signal (sub-SigA) and generates the analog signal (out-SigA) including the information A1 by obtaining the difference between the input analog signal (SigA) and the analog signal (sub-SigA).

The transistor 13t-(n−2) included in the sample-and-hold circuit 11-(n−2) is turned on and the analog signal (out-SigA) including the information A1 output from the converter circuit 12-(n−1) is sampled in the sample-and-hold circuit 11-(n−2). Specifically, the potential of the analog signal (out-SigA) including the information A1 is applied to the node ND of the sample-and-hold circuit 11-(n−2). The potential applied to the node ND is applied to the input terminal of the converter circuit 12-(n−2) from the output terminal of the sample-and-hold circuit 11-(n−2).

Note that the transistor 13t-(n−2) is turned off after determining the potential of the node ND in the sample-and-hold circuit 11-(n−2).

The converter circuit 12-(n−2) generates an n−2 bit digital signal Dn−2 (A1) corresponding to the information A1 in response to the applied potential. The generated digital signal Dn−2(A1) is applied to the digital circuit 15. The converter circuit 12-(n−2) converts the generated digital signal Dn−2(A1) into the analog signal (sub-SigA) and generates the analog signal (out-SigA) by obtaining the difference between an input analog signal (out-SigA) and the analog signal (sub-SigA).

All digital signals (sub-SigD) corresponding to the information A1, in other words, the digital signals D1 to Dn−1 corresponding to the information A1 are applied to the digital circuit 15 by performing the operation in all sample-and-hold circuits 11 and converter circuits 12. The digital circuit 15 has a function of correcting the delay of the digital signals D1 to Dn−1 and generating the n-bit digital signal (SigD) corresponding to the information A1 by adding the digital signals D1 to Dn−1 whose delay is corrected.

On the other hand, in the sample-and-hold circuit 11-(n−1), the analog signal (SigA) including the information A2 can be sampled in parallel with generation of the digital signal (sub-SigD) corresponding to the analog signal (SigA) including the information A1 in the converter circuit 12-(n−2) and the converter circuit 12 in the subsequent stage.

Specifically, the analog signal (SigA) including the information A2 is input to the semiconductor device 10 after time T2 in FIG. 3. In the sample-and-hold circuit 11-(n−1), the transistor 13t-(n−1) included in the sample-and-hold circuit 11-(n−1) is turned on and the analog signal (SigA) including the information A2 is sampled. Specifically, the potential of the analog signal (SigA) including the information A2 is applied to the node ND of the sample-and-hold circuit 11-(n−1). The potential applied to the node ND is applied to the input terminal of the converter circuit 12-(n−1) from the output terminal of the sample-and-hold circuit 11-(n−1).

Note that the transistor 13t-(n−1) is turned off after determining the potential of the node ND in the sample-and-hold circuit 11-(n−1).

The converter circuit 12-(n−1) generates the most significant bit digital signal Dn−1 (A2) corresponding to the information A2 in response to the applied potential. The generated digital signal Dn−1(A2) is applied to the digital circuit 15. The converter circuit 12-(n−1) converts the generated digital single Dn−1(A2) into the analog signal (sub-SigA) and generates the analog signal (out-SigA) including the information A2 by obtaining the difference between an input analog signal (SigA) and the analog signal (sub-SigA).

All digital signals (sub-SigD) corresponding to the information A2, in other words, the digital signals D1 to Dn−1 corresponding to the information A2 are applied to the digital circuit 15 by performing the operation in all sample-and-hold circuits 11 and converter circuits 12. The digital circuit 15 has a function of correcting the delay of the digital signals D1 to Dn−1 and generating the n-bit digital signal (SigD) corresponding to the information A2 by adding digital signals D1 to Dn−1 whose delay is corrected.

The off-state current of the transistor 13t is extremely low because one embodiment of the present invention includes an oxide semiconductor in a channel formation region of the transistor 13t included in each sample-and-hold circuit 11. Therefore, a period in which the potential of the node ND can be held can be made longer after the transistor 13t is turned off in each sample-and-hold circuit 11. It is possible to prolong from the period from sampling the analog signal (out-SigA) in one sample-and-hold circuit 11 to sampling the analog signal (out-SigA) in sample-and-hold circuit 11 in the next stage. Accordingly, the sampling rate of the semiconductor device 10 can be made low.

This embodiment can be combined with any of the other embodiments as appropriate.

Embodiment 2

Figure 4:
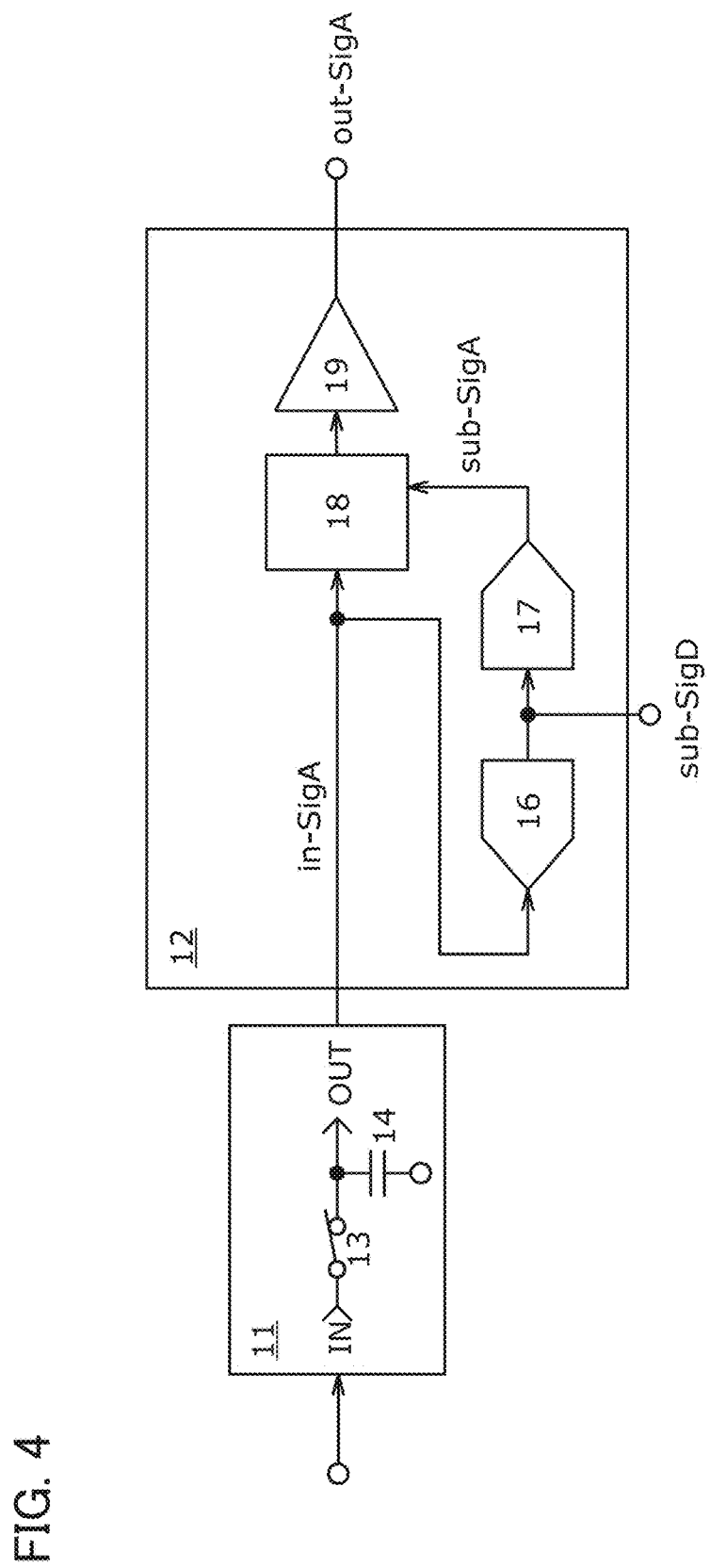
FIG. 4 illustrates a structure example of a semiconductor device.

Next, an example of a specific structure of the converter circuit 12 will be described with reference to FIG. 4. FIG. 4 illustrates a structure example of the sample-and-hold circuit 11 and the converter circuit 12. The sample-and-hold circuit 11 in FIG. 4 has a structure similar to that of the sample-and-hold circuit 11 in FIG. 1.

The converter circuit 12 in FIG. 4 includes an analog/digital converter circuit (sub-ADC) 16, a digital/analog converter circuit (sub-DAC) 17, a subtraction circuit 18, and an amplifier 19.

The sub-ADC 16 has a function of generating a t-bit digital signal (sub-SigD) from the analog signal (in-SigA) input from the sample-and-hold circuit 11. The sub-DAC 17 has a function of generating the analog signal (sub-SigA) from the generated t-bit digital signal (sub-SigD). The potential included in the analog signal (sub-SigA) corresponds to the potential of an upper t-bit digital signal included in the analog signal (in-SigA). The subtraction circuit 18 has a function of generating the analog signal (out-SigA) including the potential corresponding to a lower n-t bit digital signal included in the analog signal (in-SigA) by subtracting the analog signal (sub-SigA) from the analog signal (in-SigA).

The amplifier 19 has a function of amplifying the analog signal (out-SigA) generated in the subtraction circuit 18.

Figure 5:
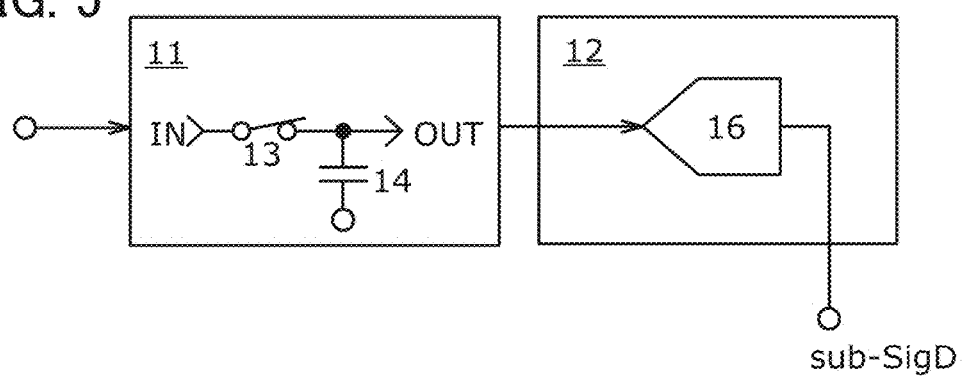
FIG. 5 illustrates a structure example of a semiconductor device.

Note that the converter circuit 12 in the final stage does not necessarily include the digital/analog converter circuit (sub-DAC) 17, the subtraction circuit 18, and the amplifier 19. FIG. 5 illustrates a structure example of the sample-and-hold circuit 11 and the converter circuit 12 in the final stage.

The sample-and-hold circuit 11 in FIG. 5 has a structure similar to that of the sample-and-hold circuit 11 in FIG. 1. The converter circuit 12 in FIG. 5 includes the sub-ADC 16. The digital signal (sub-SigD) generated in the sub-ADC 16 is input to the digital circuit 15.

This embodiment can be combined with any of the other embodiments as appropriate.

Embodiment 3

Figure 6A:
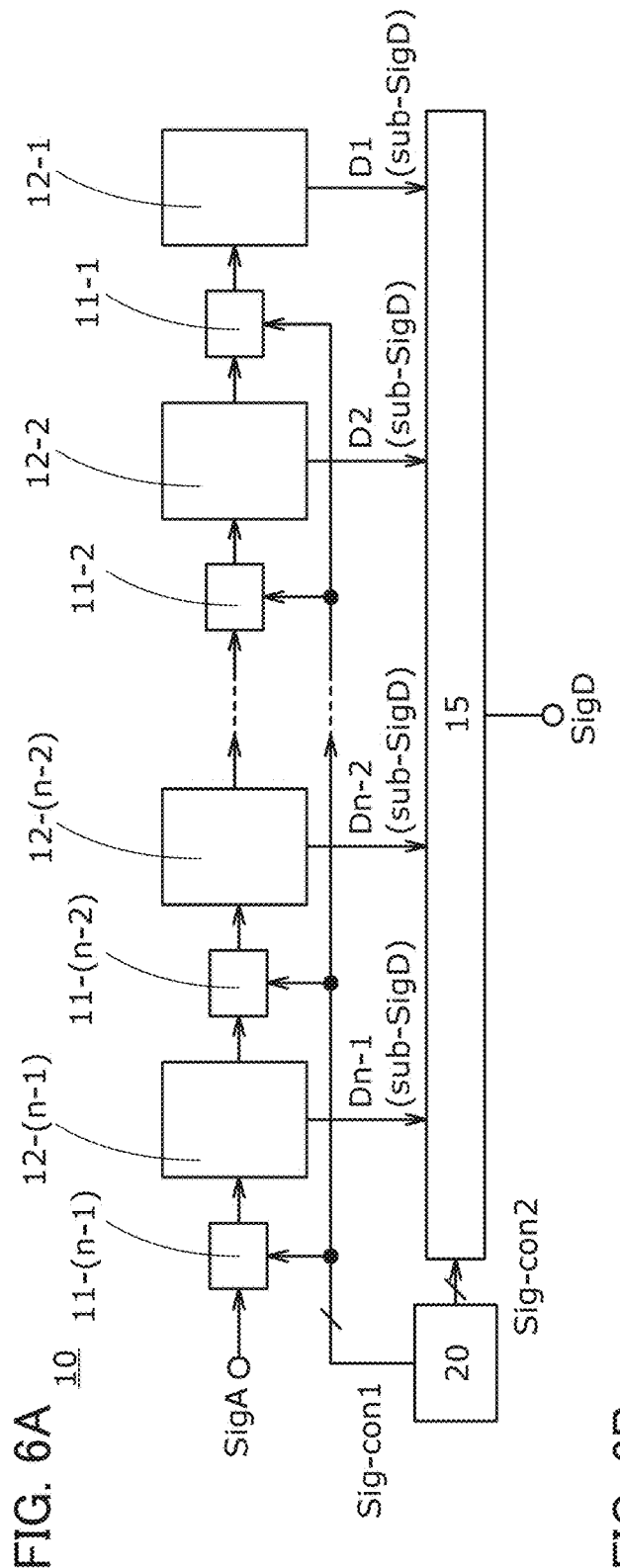
FIGS. 6A and 6B illustrate structure examples of a semiconductor device.

FIG. 6A illustrates another structure example of the semiconductor device 10 of one embodiment of the present invention. The semiconductor device 10 in FIG. 6A functions as the pipeline type ADC by including the plurality of sample-and-hold circuits 11 and the plurality of converter circuits 12 in a manner similar to the semiconductor device 10 in FIG. 2A. In addition to the components included in the semiconductor device 10 in FIG. 2A, the semiconductor device 10 in FIG. 6A includes a controller 20.

Specifically, the semiconductor device 10 in FIG. 6A includes n−1 sample-and-hold circuits 11 denoted by sample-and-hold circuits 11-1 to 11-(n−1), n−1 converter circuits 12 denoted by converter circuits 12-1 to 12-(n−1), the digital circuit 15, and the controller 20.

The controller 20 has a function of controlling the timing of operation of the sample-and-hold circuit 11 and the digital circuit 15. Specifically, in FIG. 6A, operation of the sample-and-hold circuit 11 is controlled in response to a signal Sig-con1 and operation of the digital circuit 15 is controlled in response to a signal Sig-con2.

Figure 6B:
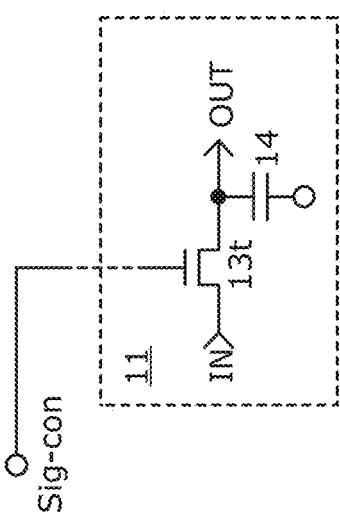

FIG. 6B illustrates an example of the specific structure of the sample-and-hold circuit 11. The sample-and-hold circuit 11 in FIG. 6B includes the transistor 13t serving as the switch 13 and the capacitor 14 in a manner similar to that of the sample-and-hold circuit 11 in FIG. 2B. The potential of the signal Sig-con1 or the potential corresponding to the signal Sig-con1 is applied to a gate of the transistor 13t. The transistor 13t in each sample-and-hold circuit 11 can perform the operation shown in the timing chart of FIG. 3 in response to the signal Sig-con1.

The digital circuit 15 has a function of correcting the delay of the digital signal (Sub-SigD) generated in each converter circuit 12 in response to the signal Sig-con2.

FIG. 7 illustrates a structure example of the digital circuit 15. The digital circuit 15 in FIG. 7 includes a delay correction circuit 21, an arithmetic circuit 22, and an output circuit 23. The delay correction circuit 21 has a function of correcting the delay of the digital signal (sub-SigD). Specifically, the delay correction circuit 21 has a function of delaying each of digital signals D2 to Dn−1 in response to a digital signal D1 which is input to the digital circuit 15 at the last timing among digital signals D1 to Dn−1.

The arithmetic circuit 22 has a function of generating a digital signal SigD by using the digital signal (sub-SigD) whose delay is corrected. Specifically, the arithmetic circuit 22 has a function of generating an n-bit digital signal SigD by performing arithmetic processing on the digital signals D1 to Dn−1.

The output circuit 23 may function as a latch which temporarily stores an n-bit digital signal SigD generated in the arithmetic circuit 22, or function as a buffer.

Figure 8:
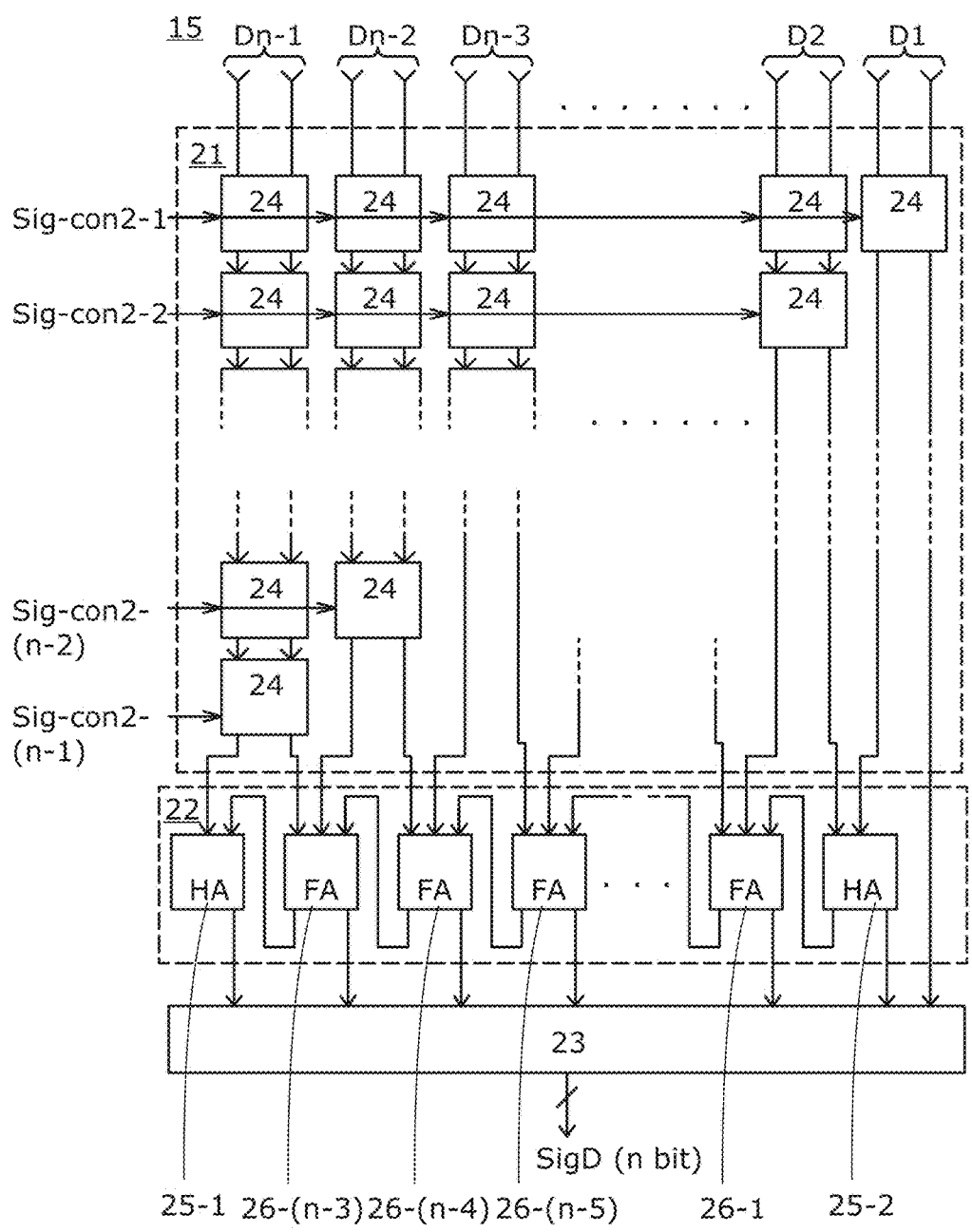
FIG. 8 illustrates a structure example of a digital circuit.

FIG. 8 illustrates a specific example of the circuit structure of the digital circuit 15. FIG. 8 illustrates the case where the digital circuit 15 generates the n-bit digital signal SigD from 1.5-bit digital signals D1 to Dn−1.

In the digital circuit 15 in FIG. 8, the delay correction circuit 21 includes a plurality of latches 24. Each latch 24 has a function of latching a signal. Specifically, the latch 24 in FIG. 8 is controlled by writing, storing, and outputting of signals in response to the signal Sig-con2.

The delayed time differs among the digital signals D1 to Dn−1 so that the number of latches 24 corresponding to the digital signals is different. In the digital circuit 15 in FIG. 8, the number of latches corresponding to the digital signal Dn−1 is the largest because the digital signal Dn−1 needs to prolong the time to be delayed, and the number of latches corresponding to the digital signal D1 is the smallest because the digital signal D1 does not need to be delayed or to shorten the time to be delayed.

Specifically, FIG. 8 illustrates the case where the number of latches 24 corresponding to an arbitrary digital signal Dm−1 (m is an arbitrary natural number greater than or equal to 2 and less than or equal to n) among the digital signal D1 to Dn−1 is m−1 in the delay correction circuit 21. In addition, m−1 latches 24 are sequentially connected in a line except when m is 2. The latch timing of a signal in the latch 24 in each stage is controlled in response to the signal Sig-con2 output from the controller 20.

Specifically, the latch 24 in the first stage corresponding to each of the digital signals D1 to Dn−1 latches an input signal in response to a signal Sig-con2−1 out of the signal Sig-con2 in FIG. 8. The latch 24 in the m-th stage latches an input signal in response to a signal Sig-con2−(m−1) out of the signal Sig-con2. By controlling the latch timing in the latch 24 in each stage in response to the signal Sig-con2, the delay time of the digital signals D1 to Dn−1 can be corrected in accordance with the digital signal D1 which is input to the digital circuit 15 at the last timing.

The arithmetic circuit 22 in FIG. 8 includes a half adder (HA) 25-1, a half adder (HA) 25-2, and n−3 full adders (FA) 26. Specifically, a first input terminal of each of the half adder (HA) 25-1, the half adder (HA) 25-2, and the n−3 full adders (FA) 26 is electrically connected to the output circuit 23. A second output terminal of the half adder (HA) 25-2 is electrically connected to a first input terminal of a full adder (FA) 26-1 in the first stage. In the n−3 full adders (FA) 26, a second output terminal of a full adder (FA) 26-$p$ in a p-th stage (p is an arbitrary number of 1 to (n−2)) is electrically connected to a first input terminal of a full adder (FA) 26-($p$+1) in a (p+1)-th stage. A second output terminal of the full adder (FA) 26-$p$ in the (n−3)-th stage is electrically connected to the first input terminal of the half adder (HA) 25-1.

In the latch 24 corresponding to the digital signal D1, a first output terminal is electrically connected to the output circuit 23, and a second output terminal is electrically connected to the first input terminal of the half adder (HA) 25-2. In the latch 24 in the final stage corresponding to the digital signal D2, a first output terminal is electrically connected to a second input terminal of the half adder (HA) 25-2, and a second output terminal is electrically connected to a second input terminal of the full adder (FA) 26-1. In the latch 24 in the final stage corresponding to a digital signal Dq (q is an arbitrary natural number of 3 to (n−2)), a first output terminal is electrically connected to a third input terminal of a full adder (FA) 26-($q$−2) and a second output terminal is electrically connected to a second input terminal of a full adder (FA) 26-($q$−1). In the latch 24 in the final stage corresponding to the digital signal Dn−1, a first output terminal is electrically connected to a third input terminal of a full adder (FA) 26-($n$−3), and a second output terminal is electrically connected to a second input terminal of the half adder (HA) 25-1.

Accordingly, the n-bit digital signal SigD is constructed from a signal output from the first output terminal of the latch 24 corresponding to the digital signal D1, a signal output from the first output terminal of the half adder (HA) 25-1, a signal output from the first output terminal of the half adder (HA) 25-2, and an output signal from the first output terminal of each of the n−3 full adders (FA) 26. The n-bit digital signal SigD constructed from the above signals is output from the output circuit 23 after being latched in the output circuit 23 or from the output circuit 23 through a buffer included in the output circuit 23.

This embodiment can be combined with any of the other embodiments as appropriate.

Embodiment 4

An example of the specific structure of the analog/digital converter circuit (sub-ADC) 16 is described with reference to FIGS. 9A and 9B.

Figure 9A:
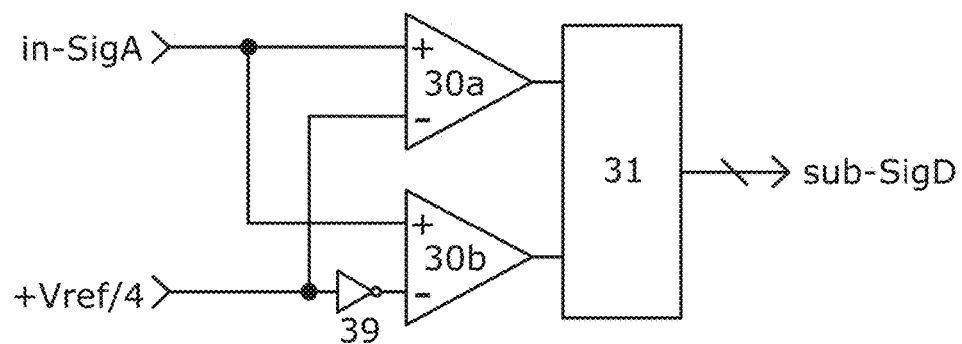
FIGS. 9A and 9B illustrate structure examples of an ADC.

The sub-ADC 16 in FIG. 9A includes a comparator 30$a$, a comparator 30$b$, an encoder 31, and an inverter 39. The analog signal (in-SigA) is input to a non-inverting input terminal (+) of the comparator 30$a$ and a non-inverting input terminal (+) of the comparator 30$b$. A reference potential is input to an inverting input terminal (−) of the comparator 30$a$, and a reference potential whose polarity is inverted by the inverter 39 is input to an inverting input terminal (−) of the comparator 30$b$.

FIG. 9A illustrates the case where +$V_{ref}$/4 is input to the inverting input terminal (−) of the comparator 30$a$ and −$V_{ref}$/4 is input to the inverting input terminal (−) of the comparator 30$b$.

An output terminal of the comparator 30$a$ and an output terminal of the comparator 30$b$ are electrically connected to the encoder 31. The encoder 31 has a function of generating the digital signal (sub-SigD) by performing arithmetic processing with use of a signal output from the output terminal of the comparator 30$a$ and a signal output from the output terminal of the comparator 30$b$. The digital signal (sub-SigD) output from the encoder 31 is output from the sub-ADC 16.

Figure 9B:
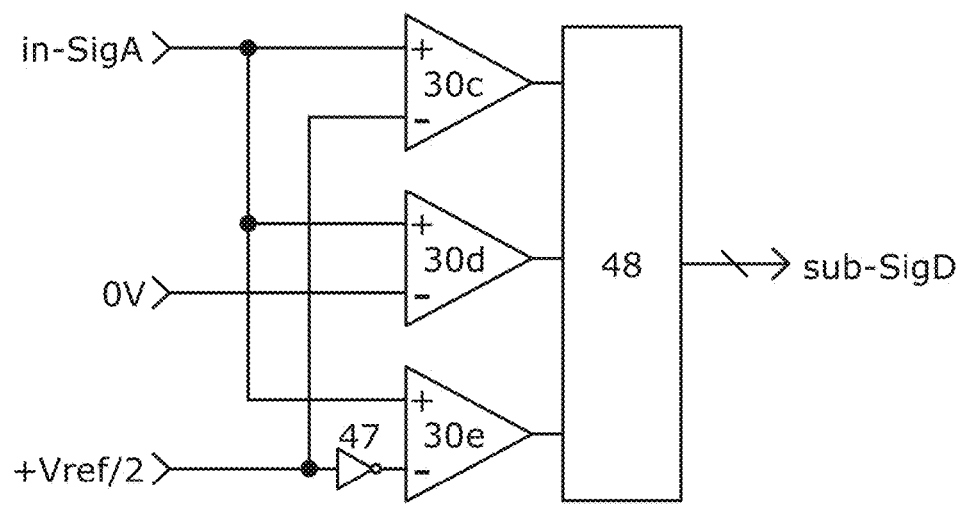

The sub-ADC 16 in FIG. 9B includes a comparator 30$c$, a comparator 30$d$, a comparator 30$e$, an encoder 48, and an inverter 47. The analog signal (in-SigA) is input to a non-inverting input terminal (+) of the comparator 30$c$, a non-inverting input terminal (+) of the comparator 30$d$, and a non-inverting input terminal (+) of the comparator 30$e$. A reference potential is input to an inverting input terminal (−) of the comparator 30c, and a reference potential whose polarity is inverted by the inverter 47 is input to an inverting input terminal (−) of the comparator 30e. A reference potential such as 0 V is input to an inverting input terminal (−) of the comparator 30d.

FIG. 9B illustrates the case where $+V_{ref}/2$ is input to the inverting input terminal (−) of the comparator 30c and $-V_{ref}/2$ is input to the inverting input terminal (−) of the comparator 30e.

An output terminal of the comparator 30c, an output terminal of the comparator 30d, and an output terminal of the comparator 30e are electrically connected to the encoder 48. The encoder 48 has a function of generating the digital signal (sub-SigD) by performing arithmetic processing with use of a signal output from the output terminal of the comparator 30c, a signal output from the output terminal of the comparator 30d, and a signal output from the output terminal of the comparator 30e. The digital signal (sub-SigD) which is output from the encoder 48 is output from the sub-ADC 16.

The sub-ADC 16 in FIG. 9A has a function of converting the input analog signal (in-SigA) into a 1.5-bit digital signal (sub-SigD), and the sub-ADC 16 in FIG. 9B has a function of converting the input analog signal (in-SigA) into a 2-bit digital signal (sub-SigD).

Specifically, when a potential Ain of the input analog signal (in-SigA) satisfies $Ain \leq -V_{ref}/4$ in the sub-ADC 16 in FIG. 9A, the encoder 31 performs arithmetic processing to generate the digital signal (sub-SigD) whose logical value is "00." When the potential Ain of the input analog signal (in-SigA) satisfies $-V_{ref}/4 < Ain \leq V_{ref}/4$, the encoder 31 performs arithmetic processing to generate the digital signal (sub-SigD) whose logical value is "01." When the potential Ain of the input analog signal (in-SigA) satisfies $V_{ref}/4 < Ain$, the encoder 31 performs arithmetic processing to generate the digital signal (sub-SigD) whose logical value is "10."

Furthermore, when the potential Ain of the input analog signal (in-SigA) satisfies $Ain \leq -V_{ref}/2$ in the sub-ADC 16 in FIG. 9B, the encoder 48 performs arithmetic processing to generate the digital signal (sub-SigD) whose logical value is "00." When the potential Ain of the input analog signal (in-SigA) satisfies $-V_{ref}/2 < Ain$ the encoder 48 performs arithmetic processing to generate the digital signal (sub-SigD) whose logical value is "01." When the potential Ain of the input analog signal (in-SigA) satisfies $0 < Ain \leq V_{ref}/2$, the encoder 48 performs arithmetic processing to generate the digital signal (sub-SigD) whose logical value is "10." When the potential Ain of the input analog signal (in-SigA) satisfies $V_{ref}/2 < Ain$, the encoder 48 performs arithmetic processing to generate the digital signal (sub-SigD) whose logical value is "11."

Next, an example of the specific structure of the digital/analog converter circuit (sub-DAC) 17 is described with reference to FIG. 10.

Figure 10:
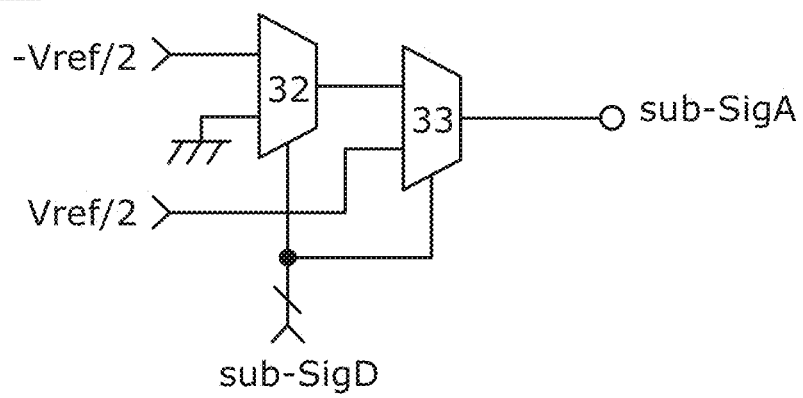
FIG. 10 illustrates a structure example of a DAC.

The sub-DAC 17 in FIG. 10 includes a selector 32 and a selector 33. A first reference potential is input to a first input terminal of the selector 32 and a predetermined potential such as a ground potential or a low-level potential is applied to a second input terminal of the selector 32. A first input terminal of the selector 33 is electrically connected to an output terminal of the selector 32, and a second reference potential is input to a second input terminal of the selector 33. The potential of an output terminal of the selector 33 is output from the sub-DAC 17 as the analog signal (sub-SigA).

The sub-DAC 17 in FIG. 10 illustrates the case where $-V_{ref}/2$ is input to the first input terminal of the selector 32 as the first reference potential and $V_{ref}/2$ is input to the second input terminal of the selector 33 as the second reference potential. The selector 32 has a function of selecting either the potential of the first input terminal or the potential of the second input terminal in response to the digital signal (sub-SigD) and outputting the potential from the output terminal. Owing to the above structure, the sub-DAC 17 in FIG. 10 has a function of converting an input 1.5-bit digital signal (sub-SigD) into an analog signal (sub-SigD).

Specifically, when the digital signal (sub-SigD) whose logical value is "00" is input to the sub-DAC 17 in FIG. 10, the potential of the first input terminal is selected in the selector 32 and the potential of the first input terminal is selected in the selector 33. Thus, $-V_{ref}/2$ which is the first reference potential is output from the sub-DAC 17. In addition, when the digital signal (sub-SigD) whose logical value is "01" is input, the potential of the second input terminal is selected in the selector 32 and the potential of the first input terminal is selected in the selector 33. A predetermined potential such as a ground potential or a low-level potential is output from the sub-DAC 17. When the digital signal (sub-SigD) whose logical value is "10" is input, the potential of the first input terminal is selected in the selector 32 and the potential of the second input terminal is selected in the selector 33. Thus, $V_{ref}/2$ which is the second reference potential is output from the sub-DAC 17.

Figure 11A:
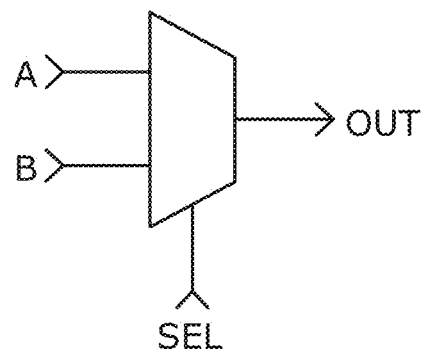
FIGS. 11A and 11B illustrate a circuit structure example of a selector.

Next, an example of the specific structure of the selector 32 and the selector 33 is described with reference to FIGS. 11A and 11B. FIG. 11A schematically illustrates the relation between the terminal of the selector 32 or the selector 33 and a signal corresponding to the terminal. Specifically, in FIG. 11A, a signal A, a signal B, a signal SEL are input to the first input terminal, the second input terminal, and the input terminal for selection of the selector 32 or the selector 33, respectively. A signal OUT is output from the output terminals of the selector 32 and the selector 33.

Figure 11B:
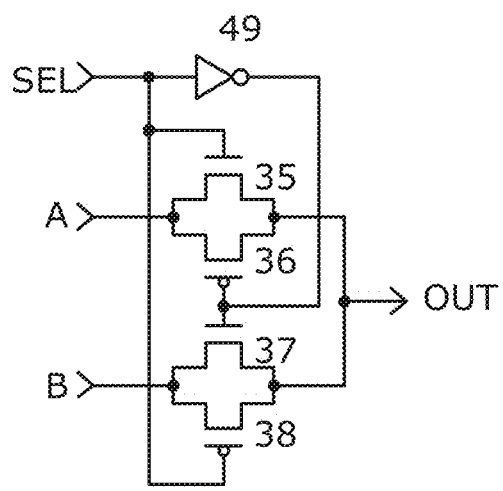

FIG. 11B illustrates an example of the specific circuit structure of the selector 32 or the selector 33 in FIG. 11A. The selector 32 or the selector 33 in FIG. 11B includes an inverter 49, n-channel transistors 35 and 37, and p-channel transistors 36 and 38. The input terminal for selection is electrically connected to an input terminal of the inverter 49, a gate of the transistor 35, and a gate of the transistor 38. The first input terminal is electrically connected to one of a source and a drain of the transistor 35 and one of a source and a drain of the transistor 36. The second input terminal is electrically connected to one of a source and a drain of the transistor 37 and one of a source and a drain of the transistor 38. The output terminal of the inverter 49 is electrically connected to a gate of the transistor 36 and a gate of the transistor 37. The output terminal is electrically connected to the other of the source and the drain of the transistor 35, the other of the source and the drain of the transistor 36, the other of the source and the drain of a transistor 37, and the other of the source and the drain of the transistor 38.

Next, structure examples of the sample-and-hold circuit 11 included in the semiconductor device 10 of one embodiment of the present invention, which are different from the structure in FIG. 2B or FIG. 6B, are described with reference to FIGS. 12A to 12C.

Figure 12A:
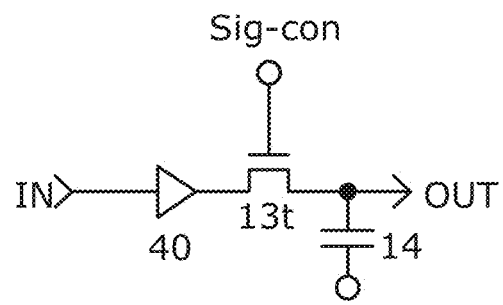
FIGS. 12A to 12C illustrate structure examples of a sample-and-hold circuit.

The sample-and-hold circuit 11 in FIG. 12A includes the transistor 13t serving as the switch 13, the capacitor 14, and a buffer 40. The buffer 40 has a function of amplifying a signal input from the input terminal of the sample-and-hold circuit 11, or functions as an impedance converter. The transistor 13t has a function of controlling supply of a signal which is input through the buffer 40 to the node ND. The capacitor 14 has a function of accumulating charges in response to the potential of the above signal. The potential of the node ND is applied to the output terminal OUT of the sample-and-hold circuit 11.

Figure 12B:
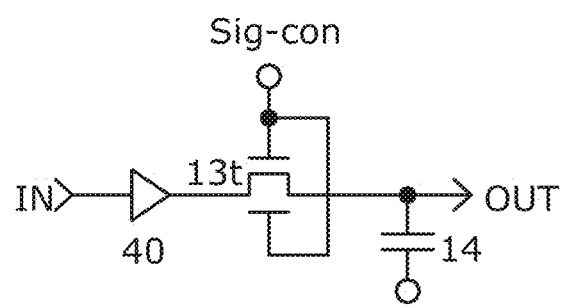

The sample-and-hold circuit 11 in FIG. 12B is different from the sample-and-hold circuit 11 in FIG. 12A in that a transistor 13t includes a pair of gates which are electrically connected with each other, and a channel formation region between the pair of gates. With the above structure, the on-state current of the transistor 13t in FIG. 12B can be increased compared with the transistor 13t in FIG. 12A.

Figure 12C:
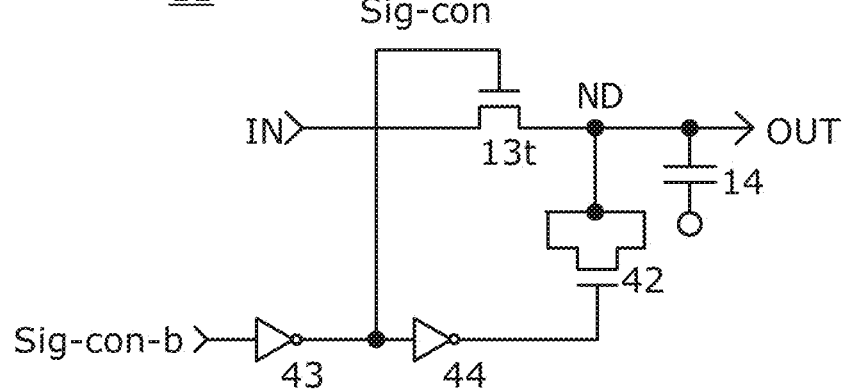

The sample-and-hold circuit 11 in FIG. 12C includes a transistor 42, an inverter 43, and an inverter 44 in addition to the components of the sample-and-hold circuit 11 in FIG. 12A. The source and the drain of the transistor 42 are electrically connected to the node ND. A signal Sig-con-b which is obtained by inverting the logical value of a signal Sig-con is input to the input terminal of the inverter 43, and the output terminal of the inverter 43 is electrically connected to the gate of the transistor 13t and the input terminal of the inverter 44. The signal Sig-con is input to the gate of the transistor 13t and the gate of the transistor 42. The above structure enables the sample-and-hold circuit 11 in FIG. 12C to suppress charge injection.

Although FIGS. 12A to 12C illustrates the case where the on/off state of the transistor 13t is directly controlled in response to the signal Sig-con, the on/off state of the transistor 13t in FIGS. 12A to 12C may be controlled in response to a signal corresponding to the signal Sig-con. In FIG. 12C, when the on/off state of the transistor 13t is controlled by a signal corresponding to the signal Sig-con, a signal corresponding to the signal Sig-con-b is input to the input terminal of the inverter 43.

This embodiment can be combined with any of the other embodiments as appropriate.

Embodiment 5

A structure of a transistor used as the transistor 13t is described.

Figure 13A:
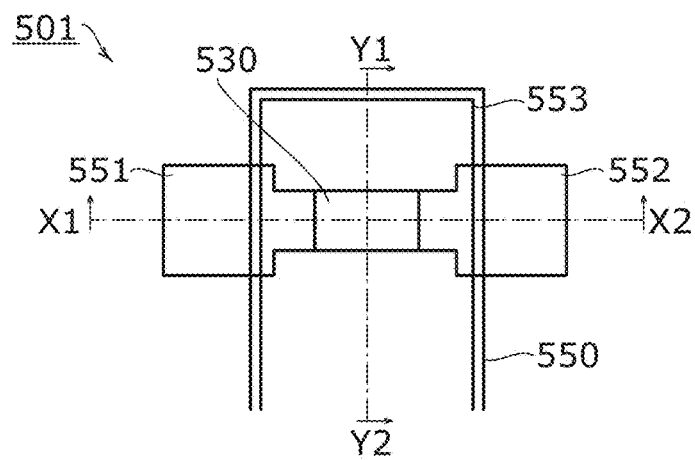
FIGS. 13A to 13C illustrate structures of a transistor.
Figures 13B, 13C:
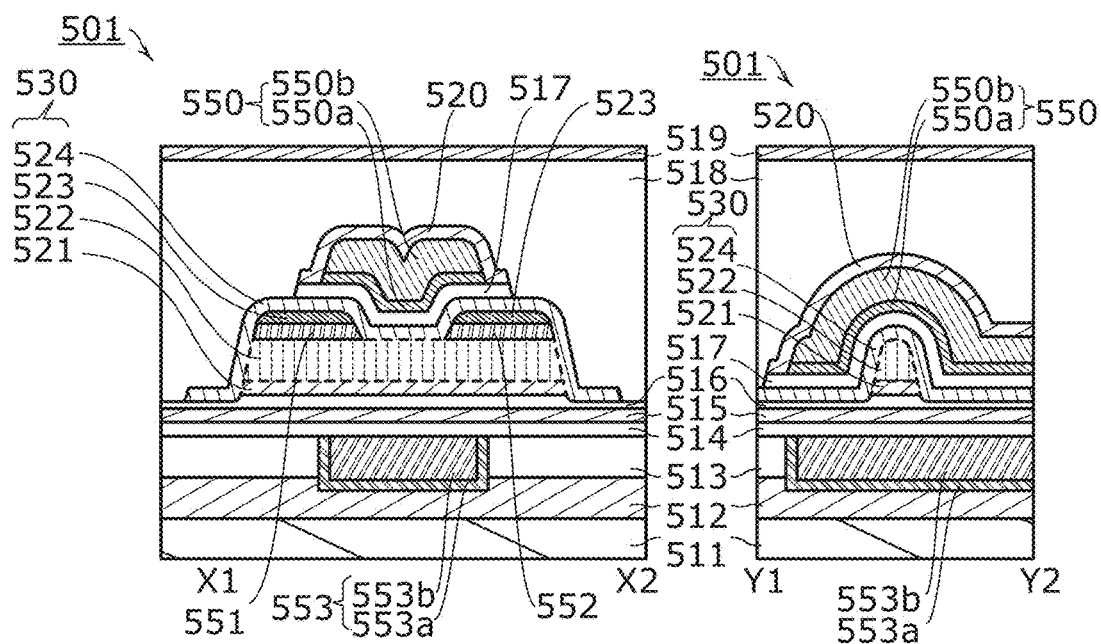

FIG. 13A is a top view illustrating a structure example of a transistor. FIG. 13B is a cross-sectional view taken along the line X1-X2 in FIG. 13A and FIG. 13C is a cross-sectional view taken along the line Y1-Y2 in FIG. 13A. Here, in some cases, the direction of the line X1-X2 is referred to as a channel length direction, and the direction of the line Y1-Y2 is referred to as a channel width direction. Accordingly, FIG. 13B illustrates a cross-sectional structure of the transistor in the channel length direction, and FIG. 13C illustrates a cross-sectional structure of the transistor in the channel width direction. Note that to clarify the device structure, some components are not illustrated in FIG. 13A.

The semiconductor device of one embodiment of the present invention includes insulating layers 512 to 520, metal oxide films 521 to 524, and conductive layers 550 to 553. A transistor 501 is formed over an insulating surface. FIG. 13B illustrates the case where the transistor 501 is formed over an insulating layer 511. The transistor 501 is covered with the insulating layer 518 and the insulating layer 519.

An insulating layer, a metal oxide film, a conductive film, and the like which construct the transistor 501 may have a single layer or a stack of a plurality of layers. Any of various deposition methods such as sputtering, molecular beam epitaxy (MBE), pulsed laser deposition (PLD), CVD, and atomic layer deposition (ALD) can be used to form these elements. Examples of CVD include plasma-enhanced CVD, thermal CVD, and metal organic CVD.

The conductive layer 550 includes a region functioning as a gate electrode (a front gate electrode) of the transistor 501. A conductive layer 551 and a conductive layer 552 include a region functioning as a source electrode and a drain electrode. A conductive layer 553 includes a region functioning as a back gate electrode. An insulating layer 517 includes a region functioning as a gate insulating layer on a gate electrode (a front gate electrode) side, and an insulating layer of a stack of insulating layers 514 to 516 includes a region functioning as a gate insulating layer on a back gate electrode. The insulating layer 518 functions as an interlayer insulating layer. The insulating layer 519 functions as a barrier layer.

Metal oxide films 521 to 524 are collectively referred to as an oxide layer 530. The oxide layer 530 includes a region where the metal oxide film 521, the metal oxide film 522, and the metal oxide film 524 are stacked in this order as shown in FIGS. 13B and 13C. A pair of metal oxide films 523 is positioned over each of the conductive layer 551 and the conductive layer 552. When the transistor 501 is turned on, a channel formation region is mainly formed in the metal oxide film 522 within the oxide layer 530.

The metal oxide film 524 covers metal oxide films 521 to 523, the conductive layer 551, and the conductive layer 552. The insulating layer 517 is positioned between the metal oxide film 523 and the conductive layer 550. The conductive layer 551 and the conductive layer 552 each include a region overlapping with the conductive layer 550 with the metal oxide film 523, the metal oxide film 524, and the insulator layer 517 provided therebetween.

The conductive layer 551 and the conductive layer 552 are formed using a hard mask used for forming the metal oxide film 521 and the metal oxide film 522. Therefore, the conductive layer 551 and the conductive layer 552 do not include a region in contact with the side surfaces of the metal oxide film 521 and the metal oxide film 522. For example, the metal oxide film 521, the metal oxide film 522, the conductive layer 551, and the conductive layer 552 can be formed through the following steps. First, a conductive film is formed over a metal oxide film including a stack of two layers. The conductive film is processed (etched) into a desired shape so that a hard mask is formed. The metal oxide film 521 and the metal oxide film 522 which are stacked are formed by processing the shape of the two-stacked layer of metal oxide films using the hard mask. The conductive layer 551 and the conductive layer 552 are formed by processing the hard mask into a desired shape.

For an insulating material used for insulating layers 511 to 518, aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, or the like can be given. The insulating layers 511 to 518 are formed using a single layer structure or a layered structure of these insulating materials. The layers used for the insulating layers 511 to 518 may include a plurality of insulating materials.

In this specification and the like, an oxynitride refers to a compound in which the oxygen content is higher than the nitrogen content, and a nitride oxide refers to a compound in which the nitrogen content is higher than the oxygen content.

The insulating layers 516 to 518 preferably contain oxygen to suppress the increase in oxygen vacancies in the oxide layer 530. The insulating layers 516 to 518 are each preferably formed using an insulating layer from which oxygen is released by heating (hereinafter also referred to as an "insulating layer containing excess oxygen"). Since oxygen is supplied from the insulating film containing excess oxygen to the oxide layer 530, the oxygen vacancy in the oxide layer 530 can be compensated. The reliability and electrical characteristics of the transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. For the oxygen adding treatment, heat treatment under an oxygen atmosphere, an ion implantation method, an ion doping method, a plasma immersion ion implantation method, plasma treatment performed under an atmosphere containing oxygen, or the like can be employed. As a gas for adding oxygen, an oxygen gas of $^{16}O_2$, $^{18}O_2$, or the like, a nitrous oxide gas, an ozone gas, or the like can be used.

The hydrogen concentration in the insulating layers 512 to 519 is preferably low in order to prevent an increase in the hydrogen concentration in the oxide layer 530. In particular, it is preferable to reduce the hydrogen concentration in the insulating layers 513 to 518. Specifically, the hydrogen concentration is less than or equal to $2 \times 10^{20}$ atoms/cm$^3$, preferably less than or equal to $5 \times 10^{19}$ atoms/cm$^3$, more preferably $1 \times 10^{19}$ atoms/cm$^3$, still more preferably $5 \times 10^{18}$ atoms/cm$^3$.

Furthermore, the nitrogen concentration in the insulating layers 513 to 518 is preferably low in order to prevent an increase in the nitrogen concentration in the oxide layer 530. Specifically, the nitrogen concentration is less than $5 \times 10^{19}$ atoms/cm$^3$, preferably less than or equal to $5 \times 10^{18}$ atoms/cm$^3$, more preferably $1 \times 10^{18}$ atoms/cm$^3$, still more preferably $5 \times 10^{17}$ atoms/cm$^3$.

Note that the concentration of hydrogen and nitrogen is measured by secondary ion mass spectrometry (SIMS).

In the transistor 501, the oxide layer 530 is preferably surrounded by an insulating layer with oxygen and hydrogen barrier properties (hereinafter such an insulating layer is referred to as a "barrier layer"). With such a structure, it is possible to suppress the release of oxygen from the oxide layer 530 and entry of hydrogen into the oxide layer 530. The reliability and electrical characteristics of the transistor 501 can be improved.

For example, the insulating layer 519 functions as a barrier layer and at least one of the insulating layers 511, 512, and 514 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 511 to 518 is described. In this example, each of the insulating layers 511, 512, 515, and 519 functions as a barrier layer.

The insulating layers 516 to 518 are oxide layers containing excess oxygen. The insulating layer 511 is formed using silicon nitride. The insulating layer 512 is formed using aluminum oxide. The insulating layer 513 is formed using silicon oxynitride. The insulating layers 514 to 516 serving as gate insulating layers on the back gate electrode side are formed using a stack of silicon oxide, aluminum oxide, and silicon oxynitride. The gate insulating layer 517 serving as a gate insulating layer on the front gate side is formed using silicon oxynitride. The insulating layer 518 serving as an interlayer insulating film is formed using silicon oxide. The insulating layer 519 is formed using aluminum oxide.

Examples of a conductive material used for the conductive layers 550 to 553 include a metal such as molybdenum, titanium, tantalum, tungsten, aluminum, copper, chromium, neodymium, or scandium; and a metal nitride containing any of the above metals as its component (e.g., tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 550 to 553 is described. The conductive layer 550 is a single layer of tantalum nitride or tungsten. Alternatively, the conductive layer 550 is a stacked-layer including tantalum nitride, tantalum, and tantalum nitride. The conductive layer 551 is a single layer of tantalum nitride or a stacked-layer including tantalum nitride and tungsten. The conductive layer 552 has a structure similar to that of the conductive layer 551. The conductive layer 553 is formed using tantalum nitride. The conductor is formed using tungsten.

In order to reduce the off-state current of the transistor 501, for example, the energy gap of the metal oxide film 522 is preferably large. The energy gap of the metal oxide film 522 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 530 has preferably crystallinity. At least the metal oxide film 522 has preferably crystallinity. With the above structure, the transistor 501 with high reliability and favorable electrical characteristics can be achieved.

As the metal oxide film 522, for example, an In—Ga oxide, an In—Zn oxide, or an In-M-Zn oxide (M is Al, Ga, Y or Sn) can be used. The metal oxide film 522 is not limited to the oxide layer containing indium. The metal oxide film 522 can be formed using a Zn—Sn oxide, a Ga—Sn oxide, or a Zn—Mg oxide, for example. Each of the metal oxide films 521, 523, and 524 can be formed using an oxide that is similar to the oxide of the metal oxide film 522. In particular, each of the metal oxide films 521, 523, and 524 can be formed using a Ga oxide.

When an interface level is formed at the interface between the metal oxide film 522 and the metal oxide film 521, a channel region is formed also in the vicinity of the interface, which causes a change in the threshold voltage of the transistor 501. It is preferable that the metal oxide film 521 contain at least one of the metal elements contained in the metal oxide film 522 as its component. Accordingly, an interface level is unlikely to be formed at the interface between the metal oxide film 522 and the metal oxide film 521, and variations in the electrical characteristics of the transistor 501, such as the threshold voltage can be reduced.

It is preferable that the metal oxide film 524 contain at least one of the metal elements contained in the metal oxide film 522 as its component because interface scattering is unlikely to occur at the interface between the metal oxide film 522 and the metal oxide film 524, and carrier transfer is not inhibited. Thus, the field-effect mobility of the transistor 501 can be increased.

It is preferable that the metal oxide film 522 have the highest carrier mobility among the metal oxide films 521 to 524. Accordingly, a channel can be formed in the metal oxide film 522 that is apart from the insulating layers 516 and 517.

In a metal oxide containing In such as an In-M-Zn oxide, carrier mobility can be increase by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

For example, the metal oxide film 522 is formed using an In—Ga—Zn oxide, and the metal oxide films 521 and 523 are formed using a Ga oxide. For example, in the case where the metal oxide films 521 to 523 are formed using an In-M-Zn oxide, the metal oxide film 522 has the highest In content among the metal oxide films 521 to 523. In the case where the In-M-Zn oxide is formed by sputtering, the In content can be changed by a change in the atomic ratio of metal elements of a target.

For example, it is preferable that the atomic ratio of metal elements of a target used for depositing the metal oxide film 522 be In:M:Zn=1:1:1, 3:1:2, or 4:2:4.1. For example, it is preferable that the atomic ratio of metal elements of a target used for depositing the metal oxide films 521 and 523 be In:M:Zn=1:3:2 or 1:3:4. The atomic ratio of an In-M-Zn oxide deposited using a target of In:M:Zn=4:2:4.1 is approximately In:M:Zn=4:2:3.

In order that the transistor 501 have stable electrical characteristics, it is preferable to reduce the concentration of impurities in the oxide layer 530. In the metal oxide, hydrogen, nitrogen, carbon, silicon, and a metal element other than a main component are impurities. For example, hydrogen and nitrogen form donor levels to increase the carrier density. In addition, silicon and carbon in the oxide semiconductor forms an impurity level. The impurity levels serve as traps and might cause the electric characteristics of the transistor to deteriorate.

For example, the oxide layer 530 includes a region where the concentration of silicon is lower than or equal to $2\times10^{18}$ atoms/cm$^3$, preferably lower than or equal to $2\times10^{17}$ atoms/cm$^3$. The same applies to the concentration of carbon in the oxide layer 530.

The oxide layer 530 includes a region where the concentration of alkaline earth metal is lower than $1\times10^{18}$ atoms/cm$^3$, preferably lower than or equal to $2\times10^{16}$ atoms/cm$^3$. The same applies to the concentration of alkaline earth metal in the oxide film 522.

The oxide layer 530 includes a region in which the concentration of nitrogen is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The oxide layer 530 includes a region where the concentration of hydrogen is lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$.

The concentration of the impurities in the metal oxide film 522 is measured by SIMS.

For example, in the case where the metal oxide film 522 contains oxygen vacancy, donor levels are formed by entry of hydrogen into sites of oxygen vacancy in some cases. The oxygen vacancy is a factor in decreasing the on-state current of the transistor 501. Note that sites of oxygen vacancy become more stable by entry of oxygen than by entry of hydrogen. Therefore, by reducing oxygen vacancy in the metal oxide film 522, the on-state current of the transistor 501 can be increased in some cases. Consequently, preventing entry of hydrogen into sites of oxygen vacancy by a reduction in hydrogen in the metal oxide film 522 is effective in improving on-state current characteristics.

Hydrogen contained in a metal oxide reacts with oxygen bonded to a metal atom to be water, and thus causes an oxygen vacancy, in some cases. Entry of hydrogen into the oxygen vacancy generates an electron serving as a carrier. Furthermore, in some cases, bonding of part of hydrogen to oxygen bonded to a metal atom causes generation of an electron serving as a carrier. Thus, the transistor 501 is likely to be normally-on when the metal oxide film 522 contains hydrogen because the metal oxide film 522 includes a channel formation region. Accordingly, it is preferable that hydrogen in the metal oxide film 522 be reduced as much as possible.

FIGS. 13A to 13C illustrate examples in which the oxide layer 530 has a four-layer structure; however, one embodiment of the present invention is not limited thereto. For example, the oxide layer 530 can have a three-layer structure without the metal oxide film 521 or the metal oxide film 523. Alternatively, the oxide layer 530 may include one or more metal oxide layers that are similar to the metal oxide films 521 to 524 at two or more of the following positions: between given layers in the oxide layer 530, over the oxide layer 530, and below the oxide layer 530.

Figure 14:
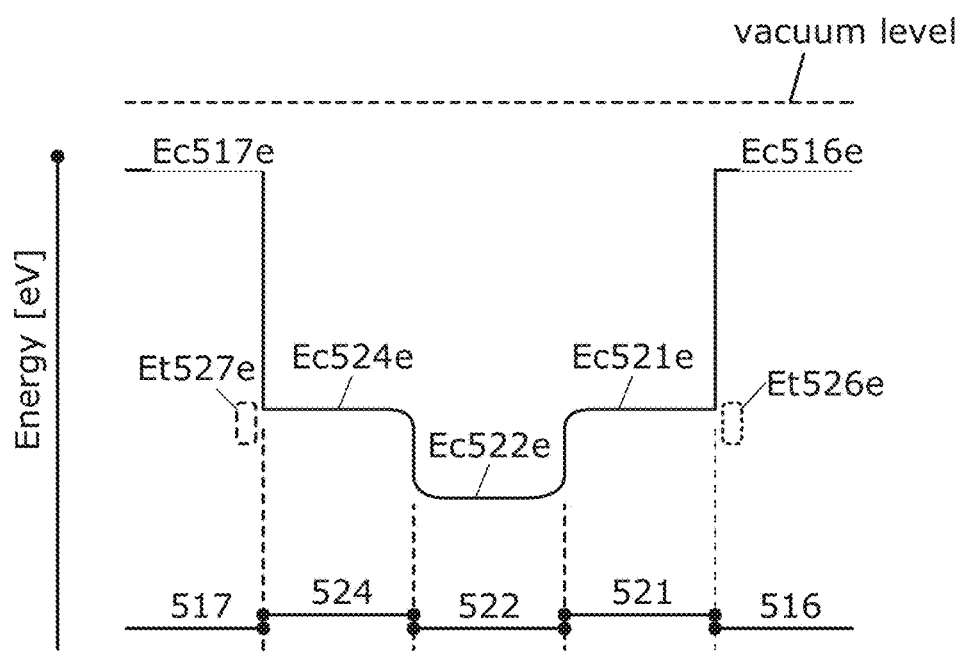
FIG. 14 is a schematic view of an energy band.

Effects of the stack of the metal oxide films 521, 522, and 524 are described with reference to FIG. 14. FIG. 14 is a schematic diagram showing the energy band structure of a channel formation region of the transistor 501.

In FIG. 14, Ec516e, Ec521e, Ec522e, Ec524e, and Ec517e indicate the energy of the conduction band minimum of the insulating layer 516, the metal oxide film 521, the metal oxide film 522, the metal oxide film 524, and the insulating layer 517, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layers 512 and 513 are insulators, Ec513e and Ec512e are closer to the vacuum level than Ec521e, Ec522e, and Ec524e (i.e., the insulating layers 512 and 513 have a smaller electron affinity than the metal oxide films 521, 522, and 524).

The metal oxide film 522 has a higher electron affinity than the metal oxide films 521 and 524. For example, the difference in electron affinity between the metal oxide films 522 and 521 and the difference in electron affinity between the metal oxide films 522 and 524 are each greater than or equal to 0.07 eV and less than or equal to 1.3 eV. The difference in electron affinity between the metal oxide films 522 and 521 and the difference in electron affinity between the metal oxide films 522 and 524 are each preferably greater than or equal to 0.1 eV and less than or equal to 0.7 eV, more preferably greater than or equal to 0.15 eV and less than or equal to 0.4 eV. Note that the electron affinity refers to an energy difference between the vacuum level and the conduction band minimum.

When voltage is applied to the gate electrode (the conductive layer 550) of the transistor 501, a channel is mainly formed in the metal oxide film 522 having the highest electron affinity among the metal oxide films 521, 522, and 524.

An indium gallium oxide has a low electron affinity and a high oxygen-blocking property. Therefore, the metal oxide film 524 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide films 521 and 522 between the metal oxide films 521 and 522. In some cases, there is also a mixed region of the metal oxide films 524 and 522 between the metal oxide films 524 and 522. Because the mixed region has low interface state density, a stack of the metal oxide films 521, 522, and 524 has a band structure where energy at each interface and in the vicinity of the interface is changed continuously (continuous junction).

Electrons transfer mainly through the metal oxide film 522 in the oxide layer 530 having such an energy band structure. Therefore, even if an interface state exists at the interface between the metal oxide film 521 and the insulating layer 512 or the interface between the metal oxide film 524 and the insulating layer 513, electron movement in the oxide layer 530 is less likely to be inhibited and the on-state current of the transistor 501 can be increased.

Although trap states Et526e and Et527e due to impurities or defects might be formed in the vicinity of the interface between the metal oxide film 521 and the insulating layer 516 and the vicinity of the interface between the metal oxide film 524 and the insulating layer 517 as illustrated in FIG. 14, the metal oxide film 522 can be separated from the trap states Et526e and Et527e owing to the existence of the metal oxide films 521 and 524.

Note that when a difference in energy between Ec521e and Ec522e is small, an electron in the metal oxide film 522 might reach the trap state Et526e by passing over the difference in energy. Since the electron is trapped at the trap state Et526e, negative fixed charge is generated at the interface with the insulating film, causing the threshold voltage of the transistor to be shifted in a positive direction. The same applies to the case where a difference in energy between Ec521e and Ec524e is small.

Each of the difference in energy between Ec521e and Ec522e and the difference in energy between Ec524e and Ec522e is preferably greater than or equal to 0.1 eV, more preferably greater than or equal to 0.15 eV so that a change in the threshold voltage of the transistor 501 can be reduced and the transistor 501 can have favorable electrical characteristics.

The transistor 501 does not necessarily include a back gate electrode.

Figure 15:
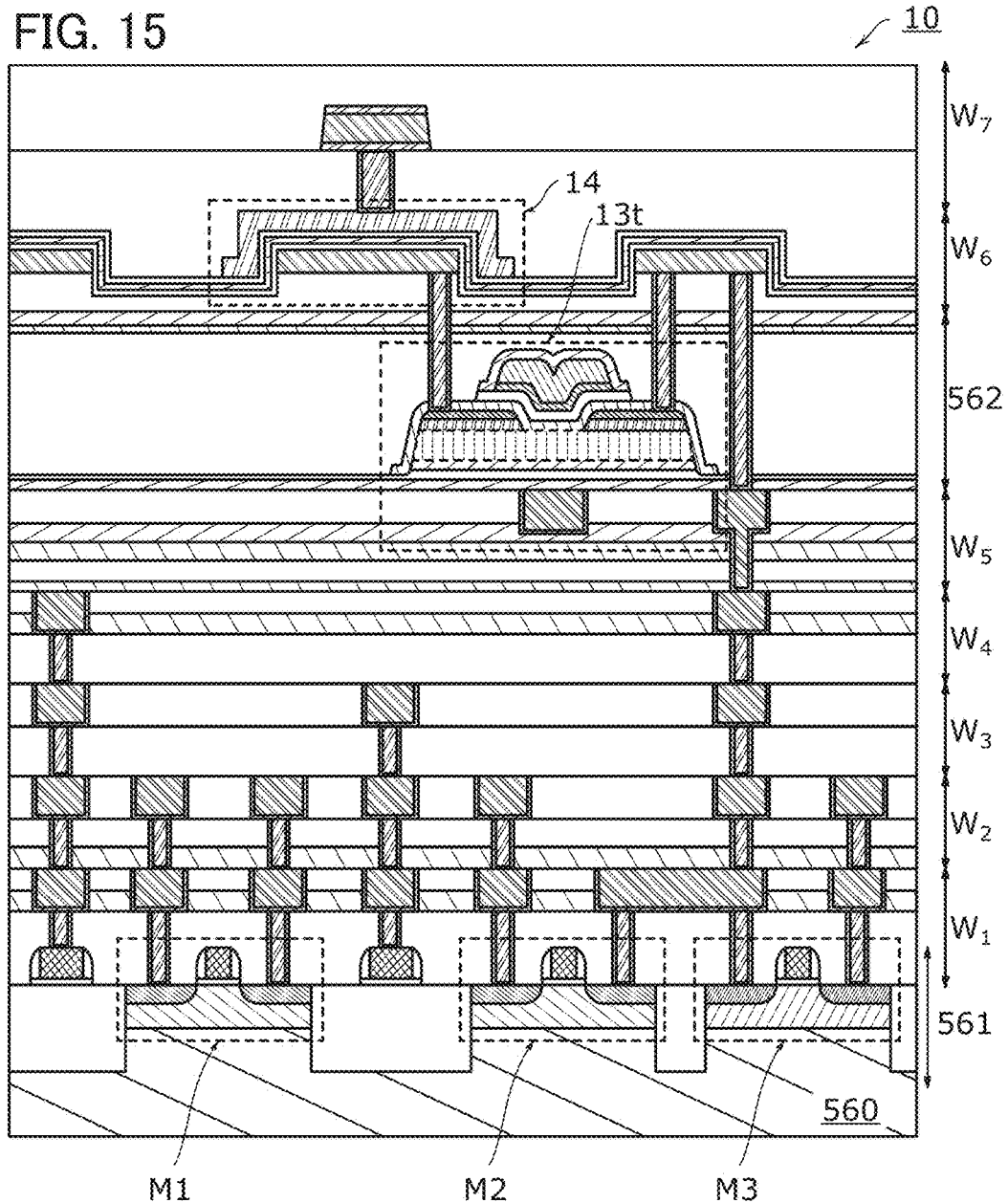
FIG. 15 illustrates a cross-sectional structure of a semiconductor device.

FIG. 15 illustrates the transistor 13t and the capacitor 14 included in the sample-and-hold circuit 11 (FIG. 2B) and a layered structure of the transistor included in the converter circuit 12 in the semiconductor device 10.

The semiconductor device 10 includes a stack of a CMOS layer 561, wiring layers $W_1$ to $W_5$, a transistor layer 562, and wiring layers $W_6$ and $W_7$.

A transistor including silicon in a channel formation region that is used for a driver circuit 504 is provided in the CMOS layer 561. Active layers of the transistors M1, M2, and M3 are formed using a single crystalline silicon wafer 560.

The transistor 13t of the sample-and-hold circuit 11 is provided in the transistor layer 562. The transistor 13t in FIG. 15 has a structure similar to that of the transistor 501 in FIGS. 13A to 13C. The back gates of these transistors are formed in the wiring layer $W_5$. The capacitor 14 is formed in the wiring layer $W_6$.

This embodiment can be combined with any of the other embodiments as appropriate.

Embodiment 6

In this embodiment, an oxide semiconductor will be described. An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

A CAAC-OS is one of oxide semiconductors having a plurality of c-axis aligned crystal parts (also referred to as pellets).

As described above, the CAAC-OS has c-axis alignment, includes crystal parts (nanocrystals) connected in the a-b plane direction, and has a crystal structure with distortion. The size of the crystal part is greater than or equal to 1 nm, or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor with a low carrier density (specifically, lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$). Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Note that there is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including randomly aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The carrier density of an oxide semiconductor is described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

As described above, oxide semiconductors have various structures and various properties. Note that an oxide semiconductor may be a stacked layer including two or more films of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

This embodiment can be combined with any of the other embodiments as appropriate.

Embodiment 7

Figure 16:
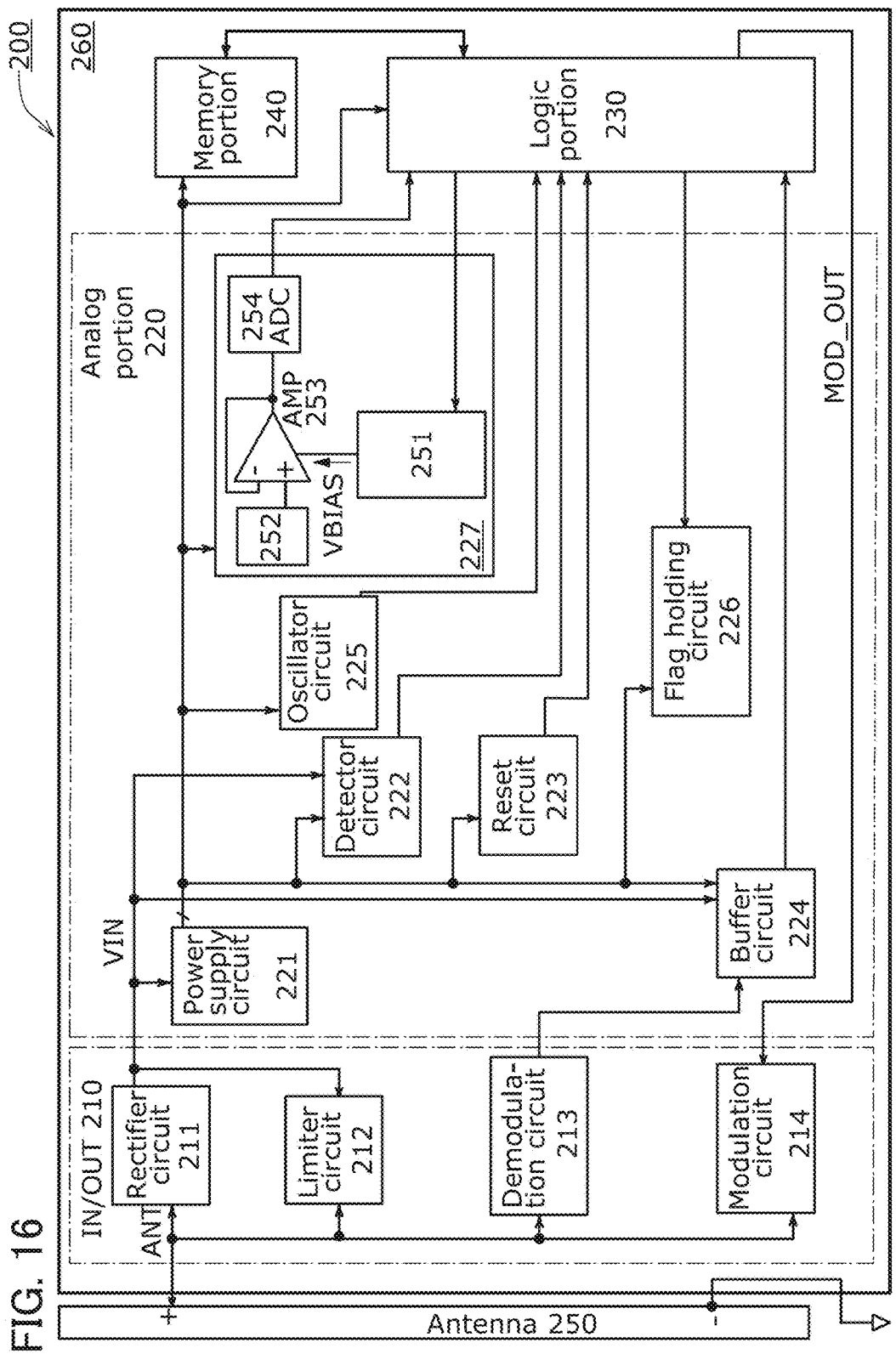
FIG. 16 is a block diagram illustrating an example of a wireless tag.

Here, a wireless tag including a sensor unit is described as an example of a semiconductor device 10. FIG. 16 is a block diagram illustrating an example of a wireless tag. Note that the wireless tag is referred to as an RFID tag, an RFID, an RF tag, an ID tag, an IC tag, an IC chip, an electronic tag, a wireless IC tag, and the like.

FIG. 16 is a block diagram illustrating a configuration example of a wireless tag. A wireless tag 200 illustrated in FIG. 16 is a passive wireless tag whose communications zone is a UHF band. The wireless tag 200 can be an active wireless tag with a built-in battery. The communications zone can be determined as appropriate depending on usage of the wireless tag 200.

As illustrated in FIG. 16, the wireless tag 200 includes an antenna 250 and a circuit portion 260. The circuit portion 260 has a function of processing a signal received by the antenna 250, a function of generating response data in accordance with the received signal, a function of outputting the response data as a carrier wave from the antenna 250, and the like. The circuit portion 260 is integrated in one IC chip, and is an electronic component called a wireless chip, an RF chip, or the like. As illustrated in FIG. 16, the circuit portion 260 includes an input/output portion (IN/OUT) 210, an analog portion 220, a logic portion 230, and a memory portion 240, for example.

The logic portion 230 controls the circuit portion 260. The logic portion 230 includes, for example, a control circuit, a clock generation circuit, a decoder circuit, a CRC circuit, a random number generating circuit, an output signal generation circuit, a register, and the like.

The control circuit controls the circuit portion 260. For example, the control circuit controls access and transmission to the memory portion 240. The decoder circuit decodes a signal output from a buffer circuit 224. The CRC circuit is a circuit that calculates a cyclic redundancy check (CRC) code from an input signal from the decoder circuit. The output signal generation circuit is a circuit that generates a signal MOD_OUT.

The input/output portion 210 includes a rectifier circuit 211, a limiter circuit 212, a demodulation circuit 213, and a modulation circuit 214.

The rectifier circuit 211 is a circuit that rectifies a signal (a carrier wave ANT) input from the antenna 250 and generates a potential VIN. The potential VIN is used as electromotive force of the circuits (the analog portion 220, the logic portion 230, and the memory portion 240). The limiter circuit 212 is a protection circuit for preventing the potential VIN from becoming high. The demodulation circuit 213 is a circuit that demodulates the carrier wave ANT received by the antenna 250. The carrier wave ANT demodulated by the demodulation circuit 213 is output from the input/output portion 210.

The modulation circuit 214 is a circuit that superimposes the signal MOD_OUT (digital signal) transmitted from the logic portion 230 on the carrier wave ANT. For example, in the case of an amplitude shift keying (ASK) modulation method, the carrier wave ANT is modulated in the modulation circuit 214 in accordance with the signal MOD_OUT transmitted from the logic portion 230, and the modulated wave is transmitted from the antenna 250.

The analog portion 220 includes a power supply circuit 221, a detector circuit 222, a reset circuit 223, a buffer circuit 224, an oscillator circuit 225, a flag holding circuit 226, and a sensor unit 227. The analog portion 220 is an analog signal processing circuit and has a function of generating an operation potential of the circuits (the analog portion 220, the logic portion 230, and the memory portion 240), a function of generating a clock signal, a function of converting a received signal into a digital signal and transmitting the signal to the logic portion 230, and the like.

The power supply circuit 221 is a circuit that generates operation potentials of the circuits (the analog portion 220, the logic portion 230, and the memory portion 240). The power supply circuit 221 generates one operation potential or two or more operation potentials with different values. The detector circuit 222 has a function of determining whether the potential VIN is higher or lower than a predetermined value and generating a digital signal corresponding to the determination result. This digital signal output from the detector circuit 222 is used as a trigger signal for operating the logic portion 230. The reset circuit 223 monitors the voltage generated by the power supply circuit 221 and generates a reset signal that resets the logic portion 230.

The buffer circuit 224 is a circuit that transmits serial data demodulated and extracted by the demodulation circuit 213, to the logic portion 230. The oscillator circuit 225 is a circuit that generates a reference clock signal from the potential signal generated by the power supply circuit 221. The flag holding circuit 226 is a circuit that holds flag data. The flag is data that shows the state of the wireless tag 200. The flag state holding period is set by International Organization for Standardization.

The sensor unit 227 includes a potential generating circuit 251, a sensor circuit 252, an AMP 253, and an ADC 254 of one embodiment of the present invention. The potential generating circuit 251 has a function of generating a bias potential VBIAS of the AMP 253 by controlling the logic portion 230.

A signal detected by the sensor unit 227 is input to the ADC 254 through the AMP 253. The ADC 254 converts an input analog signal to a digital signal and outputs the digital signal to the logic portion 230. The logic portion 230 generates the signal MOD_OUT in accordance with a signal output from the sensor unit 227. The signal MOD_OUT is modulated by the modulation circuit 214 and transmitted from the antenna 250. When a reader/writer (not illustrated) receives a signal from the wireless tag 200, the reader/writer analyzes the signal.

This embodiment can be combined with any of the other embodiments as appropriate.

Embodiment 8

Figure 17:
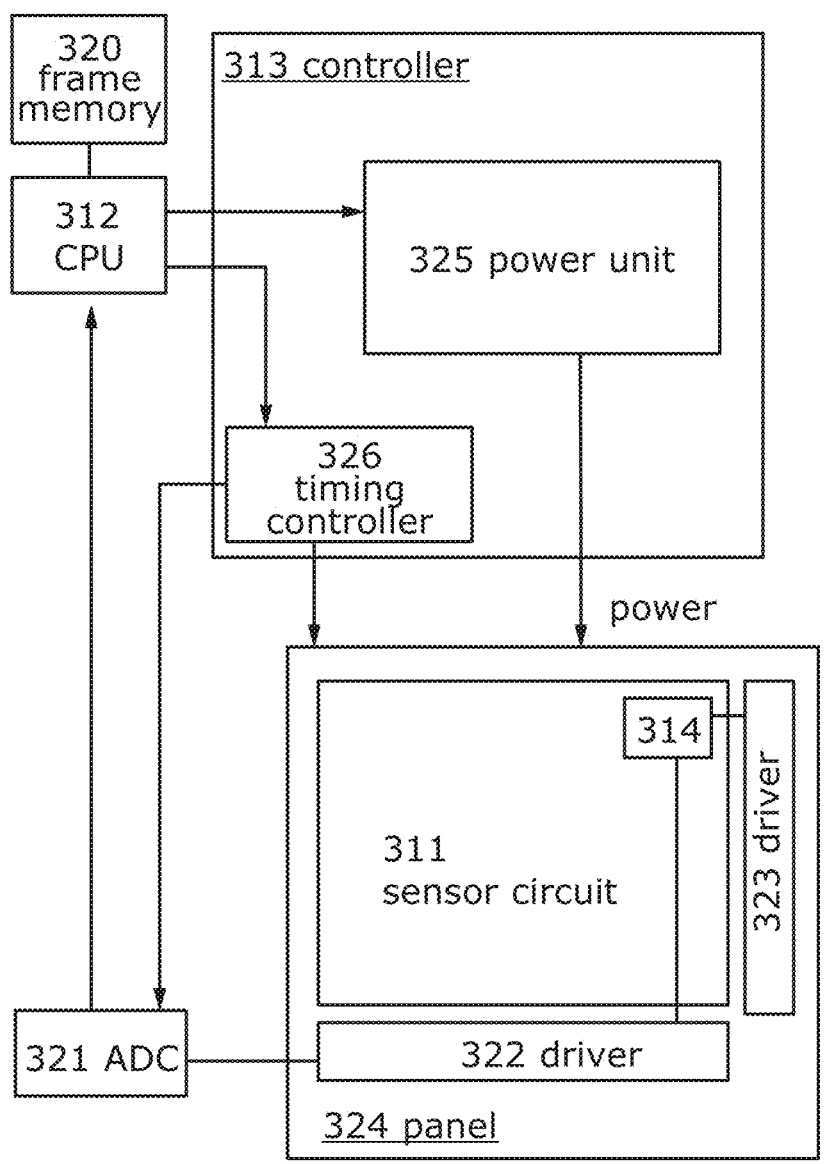
FIG. 17 illustrates a structure example of a solid-state imaging device.

Next, FIG. 17 is a block diagram illustrating a specific structure example of a solid-state imaging device 300 which corresponds to an example of the semiconductor device 10 of one embodiment of the present invention. Note that in the block diagram in FIG. 17, circuits in the solid-state imaging device 300 are classified by their functions and independent blocks are illustrated. However, it is difficult to classify actual circuits by their functions completely and, in some cases, one circuit has a plurality of functions.

The solid-state imaging device 300 in FIG. 17 includes a sensor circuit 311, a central processing unit 312, and a control circuit 313. The solid-state imaging device 300 in FIG. 17 further includes a frame memory 320, an analog/digital converter (ADC) 321 of one embodiment of the present invention, and drivers 322 and 323. In FIG. 17, the sensor circuit 311 and the drivers 322 and 323 are provided in a panel 324.

The frame memory 320 has a function of storing image information input to the solid-state imaging device 300 or image information obtained in the sensor circuit 311. Note that although only one frame memory 320 is provided in the solid-state imaging device 300 in FIG. 17, the plurality of frame memories 320 may be provided in the solid-state imaging device 300. For example, the plurality of frame memories 320 for storing image information corresponding to hues of red, blue, green, and the like may be provided in the solid-state imaging device 300.

As the frame memory 320, for example, a storage circuit such as a dynamic random access memory (DRAM) or a static random access memory (SRAM) can be used. Alternatively, a video RAM (VRAM) may be used as the frame memory 320.

The drivers 322 and 323 each have a function of controlling the operation of the plurality of pixels 314 included in the sensor circuit 311.

The central processing unit 312 has a function of controlling the timing of obtaining image information in the sensor circuit 311. Specifically, the central processing unit 312 orders a timing controller 326 included in the control circuit 313 to control the timing of obtaining image information. The timing controller 326 has a function of generating a signal which controls the timing of obtaining image information. The timing of obtaining image information in the sensor circuit 311 included in the panel 324 is controlled in response to the signal.

The analog/digital converter circuit 321 has a function of converting an analog signal containing image information output from the panel 324 into a digital signal. The timing controller 326 generates a signal which controls a sampling rate in response to the instruction from the central processing unit 312. The sampling rate of a signal including the image information in the analog/digital converter circuit 321 may be determined by the signal. The converted digital signal is stored in the frame memory 320 by the central processing unit 312.

The control circuit 313 includes a power supply device 325. The power supply device 325 has a function of generating potentials used for driving the sensor circuit 311, the drivers 322 and 323.

The timing controller 326 has a function of generating driving signals used for the drivers 322 and 323. Examples of the drive signals include a start pulse signal SP and a clock signal CK for controlling the operation of the driver 322 or 323.

Note that the solid-state imaging device 300 in FIG. 17 may further include an input device having a function of inputting information or an instruction to the central processing unit 312. As the input device, a keyboard, a pointing device, a touch panel, or the like can be used.

This embodiment can be combined with any of the other embodiments as appropriate.

Embodiment 9

The semiconductor device according to one embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can use the semiconductor device of one embodiment of the present invention, cellular phones, portable game machines, portable information terminals, electronic books, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), vending machines, and the like can be given. FIGS. 18A to 18F illustrate specific examples of these electronic devices.

Figure 18A:
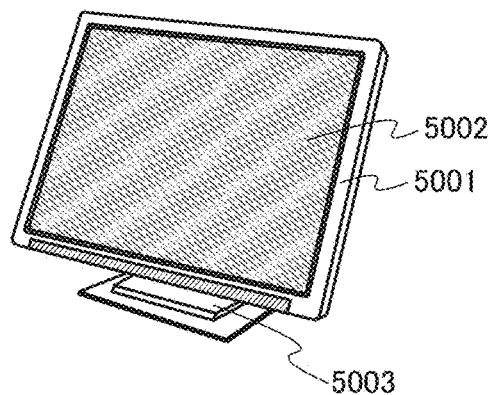
FIGS. 18A to 18F illustrate electronic devices.

FIG. 18A illustrates a display device including a housing 5001, a display portion 5002, a supporting base 5003, and the like. The semiconductor device of one embodiment of the present invention can be used for a variety of circuits. Note that the display device includes all display devices for displaying information, such as display devices for personal computers, display devices for receiving TV broadcasts, and display devices for displaying advertisements.

Figure 18B:
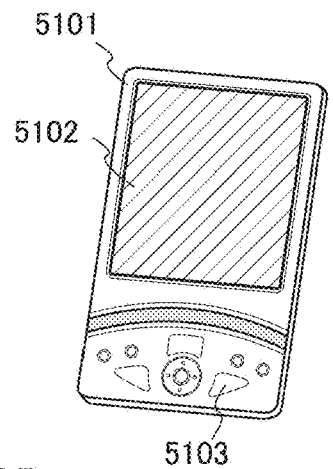

FIG. 18B illustrates a portable information terminal including a housing 5101, a display portion 5102, operation keys 5103, and the like. The semiconductor device of one embodiment of the present invention can be used for a variety of circuits.

Figure 18C:
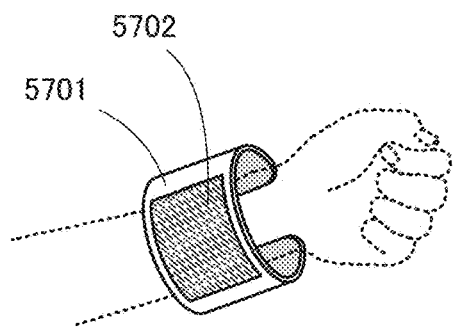

FIG. 18C illustrates a display device including a housing 5701 having a curved surface, a display portion 5702, and the like. When a flexible substrate is used for the panel, it is possible to use the panel for the display portion 5702 supported by the housing 5701 having a curved surface. Consequently, it is possible to provide a user-friendly display device that is flexible and lightweight. The semiconductor device of one embodiment of the present invention can be used for a variety of circuits.

Figure 18D:
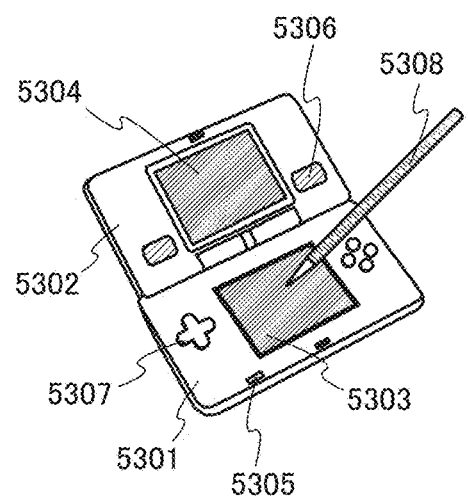

FIG. 18D illustrates a portable game machine including a housing 5301, a housing 5302, a display portion 5303, a display portion 5304, a microphone 5305, a speaker 5306, operation keys 5307, a stylus 5308, and the like. The semiconductor device of one embodiment of the present invention can be used for a variety of circuits. Note that although the portable game machine illustrated in FIG. 18D includes the two display portions 5303 and 5304, the number of display portions included in the portable game machine is not limited to two.

Figure 18E:
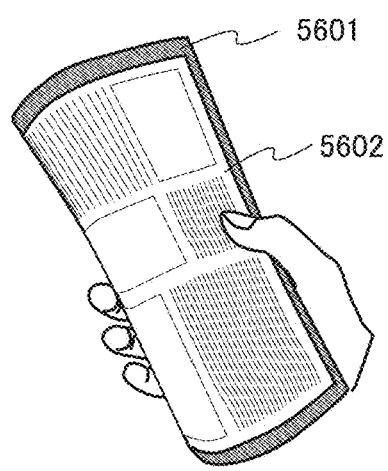

FIG. 18E illustrates an e-book reader, which includes a housing 5601, a display portion 5602, and the like. The semiconductor device of one embodiment of the present invention can be used for a variety of circuits. When a flexible substrate is used, the panel can have flexibility, so that it is possible to provide a user-friendly e-book reader that is flexible and lightweight.

Figure 18F:
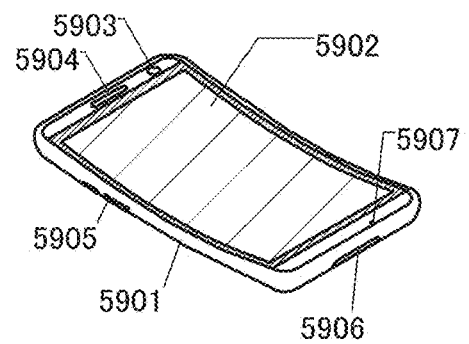

FIG. 18F illustrates a cellular phone. In the cellular phone, a display portion 5902, a microphone 5907, a speaker 5904, a camera 5903, an external connection portion 5906, and an operation button 5905 are provided in a housing 5901. The semiconductor device of one embodiment of the present invention can be used for a variety of circuits. When a panel is formed using a flexible substrate, the panel can be used for the display portion 5902 having a curved surface illustrated in FIG. 18F.

This embodiment can be combined with any of the other embodiments as appropriate.

This application is based on Japanese Patent Application serial no. 2016-011474 filed with Japan Patent Office on Jan. 25, 2016, the entire contents of which are hereby incorporated by reference.

What is claimed is:

1. A semiconductor device comprising:
a switch;
a capacitor supplied with a potential of an analog signal through the switch; and
a circuit configured to convert the analog signal supplied to the capacitor into a digital signal,
wherein a transistor included in the switch includes an oxide semiconductor in a channel formation region,
wherein the transistor included in the switch includes a first gate electrode and a second gate electrode overlapping with the first gate electrode with the channel formation region interposed therebetween, and
wherein the first gate electrode is electrically connected to the second gate electrode.

2. A semiconductor device comprising:
a first sample-and-hold circuit;
a second sample-and-hold circuit;
a first converter circuit;
a second converter circuit; and
a digital circuit,
wherein the first sample-and-hold circuit includes a first switch and a first capacitor supplied with a potential of a first analog signal through the first switch,
wherein the first converter circuit is configured to convert the first analog signal supplied to the first capacitor into a first digital signal, convert the first digital signal into a second analog signal, and generate a third analog signal by subtracting a potential of the second analog signal from the potential of the first analog signal,
wherein the second sample-and-hold circuit includes a second switch and a second capacitor supplied with a potential of the third analog signal through the second switch,
wherein the second converter circuit is configured to convert the third analog signal supplied to the second capacitor into a second digital signal, convert the second digital signal into a fourth analog signal, generate a fifth analog signal by subtracting a potential of the fourth analog signal from the potential of the third analog signal,
wherein the digital circuit is configured to generate a third digital signal corresponding to the first analog signal by using the first digital signal and the second digital signal,
wherein a first transistor included in the first switch includes an oxide semiconductor in a channel formation region, and
wherein a second transistor included in the second switch includes an oxide semiconductor in a channel formation region.

3. The semiconductor device according to claim 2,
wherein the first transistor includes a first gate electrode and a second gate electrode overlapping with the first gate electrode with the channel formation region of the first transistor interposed therebetween, and
wherein the first gate electrode is electrically connected to the second gate electrode.

4. A semiconductor device comprising:
a first sample-and-hold circuit;
a second sample-and-hold circuit;
a first converter circuit;
a second converter circuit; and
a digital circuit,
wherein an output terminal of the first sample-and-hold circuit is electrically connected to an input terminal of the first converter circuit,
wherein an output terminal of the first converter circuit is electrically connected to an input terminal of the second sample-and-hold circuit,
wherein an output terminal of the second sample-and-hold circuit is electrically connected to an input terminal of the second converter circuit,
wherein the first sample-and-hold circuit includes a first transistor and a first capacitor,
wherein the second sample-and-hold circuit includes a second transistor and a second capacitor,
wherein the digital circuit is configured to generate a digital signal by using a digital signal from the first converter circuit and a digital signal from the second converter circuit,
wherein the first transistor includes an oxide semiconductor in a channel formation region, and
wherein the second transistor includes an oxide semiconductor in a channel formation region.

5. The semiconductor device according to claim 4,
wherein the first transistor includes a first gate electrode and a second gate electrode overlapping with the first gate electrode with the channel formation region of the first transistor interposed therebetween, and
wherein the first gate electrode is electrically connected to the second gate electrode.

6. The semiconductor device according to claim 1, wherein the oxide semiconductor includes indium, gallium, and zinc.

7. The semiconductor device according to claim 2, wherein each of the oxide semiconductor of the first transistor and the oxide semiconductor of the second transistor includes indium, gallium, and zinc.

8. The semiconductor device according to claim 4, wherein each of the oxide semiconductor of the first transistor and the oxide semiconductor of the second transistor includes indium, gallium, and zinc.

9. The semiconductor device according to claim 1, wherein one of a source and a drain of the transistor is electrically connected to the circuit and one of a pair of electrodes of the capacitor.

10. The semiconductor device according to claim 2, wherein one of a source and a drain of the first transistor is electrically connected to an output terminal of the first sample-and-hold circuit and one of a pair of electrodes of the first capacitor.

11. The semiconductor device according to claim 4, wherein one of a source and a drain of the first transistor is electrically connected to the output terminal of the first sample-and-hold circuit and one of a pair of electrodes of the first capacitor.

12. The semiconductor device according to claim 1, wherein the circuit includes an analog/digital converter circuit, a digital/analog converter circuit, and a subtraction circuit.

13. The semiconductor device according to claim 2, wherein each of the first converter circuit and the second converter circuit includes an analog/digital converter circuit, a digital/analog converter circuit, and a subtraction circuit.

14. The semiconductor device according to claim 4, wherein each of the first converter circuit and the second converter circuit includes an analog/digital converter circuit, a digital/analog converter circuit, and a subtraction circuit.

15. The semiconductor device according to claim 4,
wherein the first capacitor is configured to be supplied with a potential of a first analog signal through the first transistor, wherein the first converter circuit is configured to convert the first analog signal supplied to the first capacitor into a first digital signal, convert the first digital signal into a second analog signal, and generate a third analog signal by subtracting a potential of the second analog signal from the potential of the first analog signal, wherein the second capacitor is configured to be supplied with a potential of the third analog signal through the second transistor, and wherein the second converter circuit is configured to convert the third analog signal supplied to the second capacitor into a second digital signal, convert the second digital signal into a fourth analog signal, generate a fifth analog signal by subtracting a potential of the fourth analog signal from the potential of the third analog signal.

\* \* \* \* \*